United States Patent
Ching et al.

(10) Patent No.: US 9,698,058 B2
(45) Date of Patent: Jul. 4, 2017

(54) STRUCTURE AND METHOD FOR FINFET DEVICE

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Chih-Sheng Chang, Hsinchu (TW); Zhiqiang Wu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/924,422

(22) Filed: Oct. 27, 2015

(65) Prior Publication Data

US 2016/0049338 A1 Feb. 18, 2016

Related U.S. Application Data

(62) Division of application No. 14/458,484, filed on Aug. 13, 2014, now Pat. No. 9,178,067.

(Continued)

(51) Int. Cl.
*H01L 21/8238* (2006.01)
*H01L 29/78* (2006.01)
(Continued)

(52) U.S. Cl.
CPC .. *H01L 21/823821* (2013.01); *H01L 21/0214* (2013.01); *H01L 21/0217* (2013.01);
(Continued)

(58) Field of Classification Search
None
See application file for complete search history.

(56) References Cited

U.S. PATENT DOCUMENTS 6,359,311 B1   3/2002  Colinge et al.
6,475,869 B1  11/2002  Yu
(Continued)

OTHER PUBLICATIONS

U.S. Appl. No. 13/902,322, filed May 24, 2013, by inventors Chih-Hao Wang, Kuo-Cheng Ching, Gwan Sin Chang, and Zhiqiang Wu for "FinFET Device and Method of Fabricating Same," 20 pages of text, 15 pages of drawings.

(Continued)

*Primary Examiner* — Matthew Landau
*Assistant Examiner* — Grant Withers
(74) *Attorney, Agent, or Firm* — Haynes and Boone, LLP

(57) ABSTRACT

The present disclosure provides an embodiment of a fin-like field-effect transistor (FinFET) device. The device includes a substrate having a first gate region, a first fin structure over the substrate in the first gate region. The first fin structure includes an upper semiconductor material member, a lower semiconductor material member, surrounded by an oxide feature and a liner wrapping around the oxide feature of the lower semiconductor material member, and extending upwards to wrap around a lower portion of the upper semiconductor material member. The device also includes a dielectric layer laterally proximate to an upper portion of the upper semiconductor material member. Therefore the upper semiconductor material member includes a middle portion that is neither laterally proximate to the dielectric layer nor wrapped by the liner.

20 Claims, 28 Drawing Sheets

Related U.S. Application Data

(60) Provisional application No. 61/984,475, filed on Apr. 25, 2014.

(51) Int. Cl.
  *H01L 29/06* (2006.01)
  *H01L 27/092* (2006.01)
  *H01L 29/423* (2006.01)
  *H01L 29/772* (2006.01)
  *H01L 27/088* (2006.01)
  *H01L 27/12* (2006.01)
  *H01L 29/66* (2006.01)
  *H01L 21/02* (2006.01)
  *H01L 21/84* (2006.01)
  *H01L 29/165* (2006.01)

(52) U.S. Cl.
  CPC .. *H01L 21/02178* (2013.01); *H01L 21/02233* (2013.01); *H01L 21/02255* (2013.01); *H01L 21/02532* (2013.01); *H01L 21/823878* (2013.01); *H01L 21/845* (2013.01); *H01L 27/0886* (2013.01); *H01L 27/0922* (2013.01); *H01L 27/0924* (2013.01); *H01L 27/1211* (2013.01); *H01L 29/0603* (2013.01); *H01L 29/0607* (2013.01); *H01L 29/0649* (2013.01); *H01L 29/0657* (2013.01); *H01L 29/42356* (2013.01); *H01L 29/66636* (2013.01); *H01L 29/66795* (2013.01); *H01L 29/772* (2013.01); *H01L 29/785* (2013.01); *H01L 29/7831* (2013.01); *H01L 29/7849* (2013.01); *H01L 29/7855* (2013.01); *H01L 29/165* (2013.01); *H01L 29/66545* (2013.01)

(56) References Cited

U.S. PATENT DOCUMENTS

| | | | |
|---|---|---|---|
| 7,074,662 B2 | 7/2006 | Lee et al. | |
| 7,078,299 B2 | 7/2006 | Maszara et al. | |
| 7,741,182 B2 | 6/2010 | Van Noort et al. | |
| 7,855,105 B1 | 12/2010 | Jagannathan et al. | |
| 7,939,403 B2 | 5/2011 | Grisham et al. | |
| 8,455,307 B2 | 6/2013 | Cho | |
| 8,716,074 B2 | 5/2014 | Maszara et al. | |
| 8,759,943 B2 | 6/2014 | Tseng et al. | |
| 8,815,670 B2 | 8/2014 | Basker et al. | |
| 8,883,570 B2 | 11/2014 | Lu | |
| 8,901,607 B2 | 12/2014 | Wang et al. | |
| 8,932,927 B2 | 1/2015 | Zhou et al. | |
| 8,987,790 B2 | 3/2015 | Cheng et al. | |
| 9,006,786 B2 | 4/2015 | Ching et al. | |
| 9,209,185 B2 | 12/2015 | Ching et al. | |
| 9,257,559 B2 | 2/2016 | Ching et al. | |
| 9,318,606 B2 | 4/2016 | Wang et al. | |
| 2002/0109182 A1 | 8/2002 | Lee et al. | |
| 2005/0104096 A1* | 5/2005 | Lee | H01L 21/823842 257/288 |
| 2005/0112851 A1 | 5/2005 | Lee et al. | |
| 2005/0184316 A1 | 8/2005 | Kim et al. | |
| 2005/0242376 A1 | 11/2005 | Chen et al. | |
| 2005/0272192 A1 | 12/2005 | Oh et al. | |
| 2006/0044915 A1 | 3/2006 | Park et al. | |
| 2006/0076625 A1 | 4/2006 | Lee et al. | |
| 2006/0118876 A1 | 6/2006 | Lee et al. | |
| 2006/0177998 A1 | 8/2006 | Lin et al. | |
| 2007/0057325 A1 | 3/2007 | Hsu et al. | |
| 2008/0079094 A1 | 4/2008 | Jin et al. | |
| 2009/0008705 A1 | 1/2009 | Zhu et al. | |
| 2009/0095980 A1* | 4/2009 | Yu | H01L 29/66795 257/190 |
| 2009/0130826 A1 | 5/2009 | Kim et al. | |
| 2010/0163842 A1 | 7/2010 | Lai et al. | |
| 2010/0163971 A1 | 7/2010 | Hung et al. | |
| 2010/0207201 A1 | 8/2010 | Masuoka et al. | |
| 2010/0264468 A1 | 10/2010 | Xu | |
| 2011/0049613 A1 | 3/2011 | Yeh et al. | |
| 2011/0073952 A1 | 3/2011 | Kwok et al. | |
| 2011/0081764 A1 | 4/2011 | Maszara et al. | |
| 2011/0097889 A1* | 4/2011 | Yuan | H01L 21/76224 438/595 |
| 2011/0108920 A1 | 5/2011 | Basker et al. | |
| 2011/0147711 A1 | 6/2011 | Pillarisetty et al. | |
| 2011/0147811 A1 | 6/2011 | Kavalieros et al. | |
| 2011/0193141 A1 | 8/2011 | Lin et al. | |
| 2011/0193178 A1 | 8/2011 | Chang et al. | |
| 2011/0233679 A1 | 9/2011 | Chen et al. | |
| 2012/0086053 A1 | 4/2012 | Tseng et al. | |
| 2012/0235224 A1 | 9/2012 | Yeh et al. | |
| 2012/0292672 A1 | 11/2012 | Cho et al. | |
| 2013/0005114 A1 | 1/2013 | Maszara et al. | |
| 2013/0056795 A1 | 3/2013 | Wu et al. | |
| 2013/0102137 A1 | 4/2013 | Jeng et al. | |
| 2013/0113042 A1 | 5/2013 | Wang et al. | |
| 2013/0119482 A1 | 5/2013 | Wann et al. | |
| 2013/0175621 A1 | 7/2013 | Chen et al. | |
| 2013/0230953 A1 | 9/2013 | Sudo et al. | |
| 2013/0299875 A1 | 11/2013 | Hong et al. | |
| 2014/0008734 A1 | 1/2014 | Lu et al. | |
| 2014/0015015 A1 | 1/2014 | Krivokapic et al. | |
| 2014/0042526 A1 | 2/2014 | Masuoka et al. | |
| 2014/0117462 A1* | 5/2014 | Cheng | H01L 29/66803 257/410 |
| 2014/0175551 A1 | 6/2014 | Lin et al. | |
| 2014/0175561 A1 | 6/2014 | Colinge et al. | |
| 2014/0197456 A1 | 7/2014 | Wang et al. | |
| 2014/0197457 A1 | 7/2014 | Wang et al. | |
| 2014/0197458 A1 | 7/2014 | Ching et al. | |
| 2014/0203333 A1 | 7/2014 | Huang et al. | |
| 2014/0203334 A1 | 7/2014 | Colinge et al. | |
| 2014/0217483 A1 | 8/2014 | Choi et al. | |
| 2014/0225219 A1* | 8/2014 | Huang | H01L 29/66795 257/510 |
| 2014/0227858 A1* | 8/2014 | Shen | H01L 21/76224 438/430 |
| 2014/0252469 A1 | 9/2014 | Lee et al. | |
| 2014/0264483 A1 | 9/2014 | Yoshida et al. | |
| 2014/0264592 A1 | 9/2014 | Oxland et al. | |
| 2014/0264610 A1 | 9/2014 | Yang et al. | |
| 2014/0283599 A1 | 9/2014 | Kim et al. | |
| 2014/0299934 A1 | 10/2014 | Kim et al. | |
| 2014/0306297 A1 | 10/2014 | Ching et al. | |
| 2014/0312398 A1 | 10/2014 | Ching et al. | |
| 2014/0312432 A1 | 10/2014 | Ching et al. | |
| 2014/0353731 A1 | 12/2014 | Colinge et al. | |
| 2014/0374832 A1 | 12/2014 | Kuoh et al. | |
| 2015/0008483 A1 | 1/2015 | Ching et al. | |
| 2015/0008489 A1 | 1/2015 | Ching et al. | |
| 2015/0021695 A1 | 1/2015 | Hu et al. | |
| 2015/0021697 A1 | 1/2015 | Colinge et al. | |
| 2015/0028426 A1 | 1/2015 | Ching et al. | |
| 2015/0041911 A1 | 2/2015 | Chan et al. | |
| 2015/0060960 A1 | 3/2015 | Xie et al. | |
| 2015/0102424 A1 | 4/2015 | Colinge | |
| 2015/0200267 A1* | 7/2015 | Ching | H01L 29/6656 257/401 |
| 2015/0200300 A1 | 7/2015 | Ching et al. | |
| 2015/0303198 A1 | 10/2015 | Ching et al. | |
| 2015/0303305 A1 | 10/2015 | Ching et al. | |

OTHER PUBLICATIONS

U.S. Appl. No. 13/740,37, filed Jan. 14, 2013, by inventors Chih-Hao Wang, Kuo-Cheng Ching, Gwan Sin Chang, and Zhiqiang Wu for "Semiconductor Device and Fabricating the Same," 21 pages of text, 17 pages of drawings.

U.S. Appl. No. 13/934,992, filed Jul. 3, 2013, by inventors Kuo-Cheng Ching, Chih-Hao Wang, Zhiqiang Wu and Carlos H. Diaz for "Fin Structure of Semiconductor Device," 21 pages of text, 12 pages of drawings.

(56) References Cited

OTHER PUBLICATIONS

U.S. Appl. No. 14/156,793, filed Jan. 16, 2014, by inventors Kuo-Cheng Ching, Chih-Hao Wang, Zhiqiang Wu and Carlos H. Diaz for "Semiconductor Device and Formation Thereof," 15 pages of text, 12 pages of drawings.

U.S. Appl. No. 14/254,035, filed Apr. 16, 2014, by inventors Kuo-Cheng Ching, Ka-Hing Fung, Chih Sheng Chang and Zhiqiang Wu for "FinFET Device with High-K Metal Gate Stack," 22 pages of text, 14 pages of drawings.

U.S. Appl. No. 14/254,072, filed Apr. 16, 2014, by inventors Kuo-Cheng Ching, Ka-Hing Fung, Chih Sheng Chang and Zhiqiang Wu for "A Method and Structure for FinFET Device," 25 pages of text, 14 pages of drawings.

Masanori Tanaka et al., "Abnormal Oxidation Characteristics of SiGe/Si-on-insulator Structures Depending on Piled-Up Ge Fraction at SiO2/SiGe Interface." Journal of Applied Physics 103, 2006, pp. 054909-1 through 054909-5, American Institute of Physics.

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.

Tetlin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

P. Gas et al., "Diffusion of Sb, Ga, Ge, and (AS) in TiSi2," Journal of Applied Physics, Jun. 1, 1988, pp. 5335-5345, vol. 63, No. 11, American Institute of Physics.

\* cited by examiner

STRUCTURE AND METHOD FOR FINFET DEVICE

PRIORITY DATA

The present application is a divisional application of U.S. patent application Ser. No. 14/458,484, filed Aug. 13, 2014, which claims priority to U.S. provisional patent application No. 61/984,475, filed on Apr. 25, 2014, each of which is hereby incorporated by reference in its entirety.

RELATED APPLICATION

This application is related to patent applications U.S. Ser. No. 13/740,373 filed on Jan. 14, 2013, as "Semiconductor Device and Fabricating the Same;" U.S. Ser. No. 13/902,322 filed on May 24, 2013, as "FinFET Device and Method of Fabricating Same;" U.S. Ser. No. 13/934,992 filed on Jul. 3, 2013, as "Fin Structure of Semiconductor Device;" and U.S. Ser. No. 14/155,793 filed on Jan. 15, 2014, as "Semiconductor Device and Formation Thereof," the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
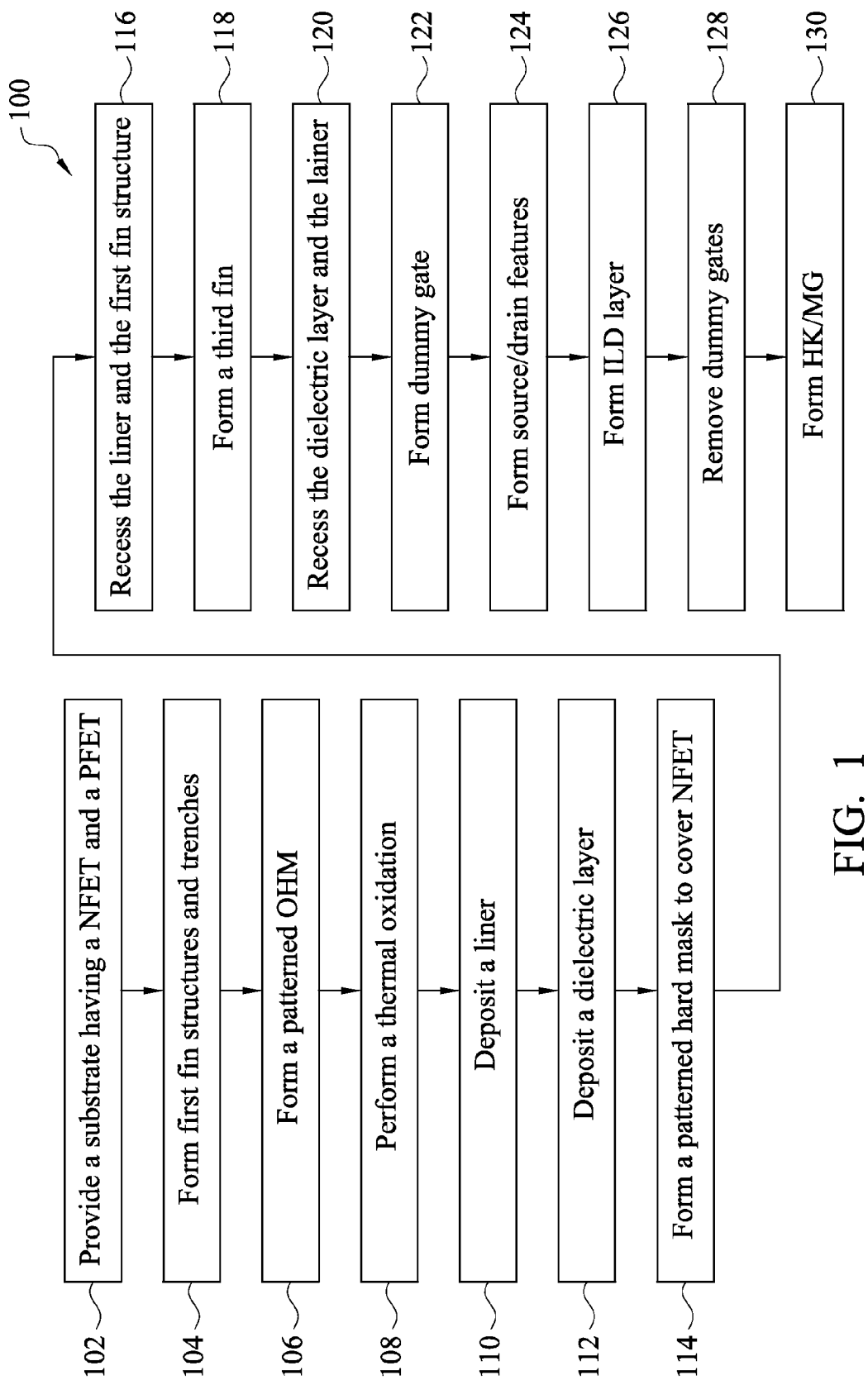
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2A:
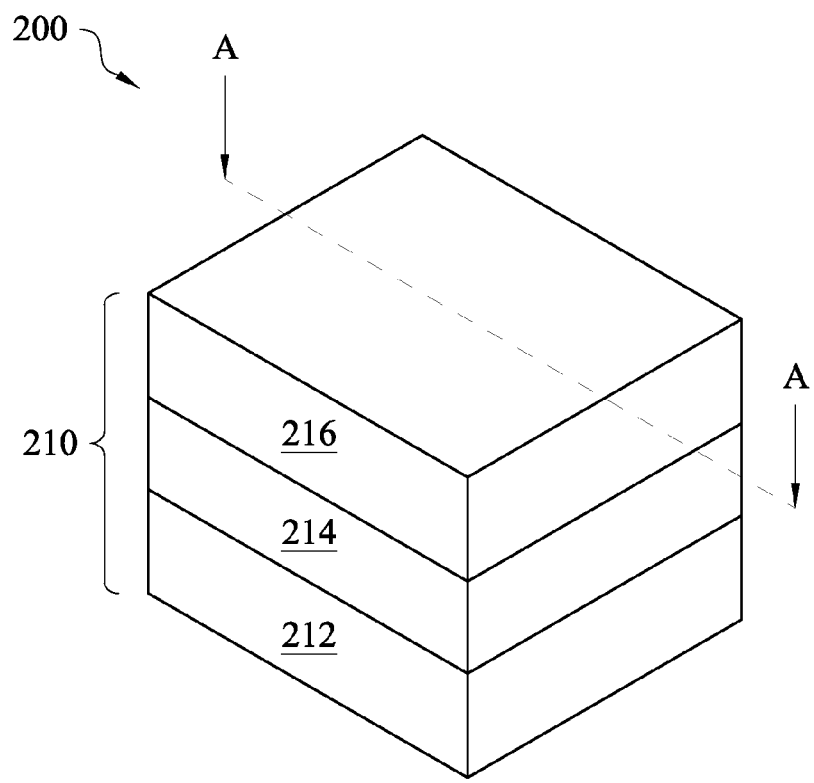
FIG. 2A is a diagrammatic perspective view of an example FinFET device undergoing processes in accordance with some embodiments.
Figure 2B:
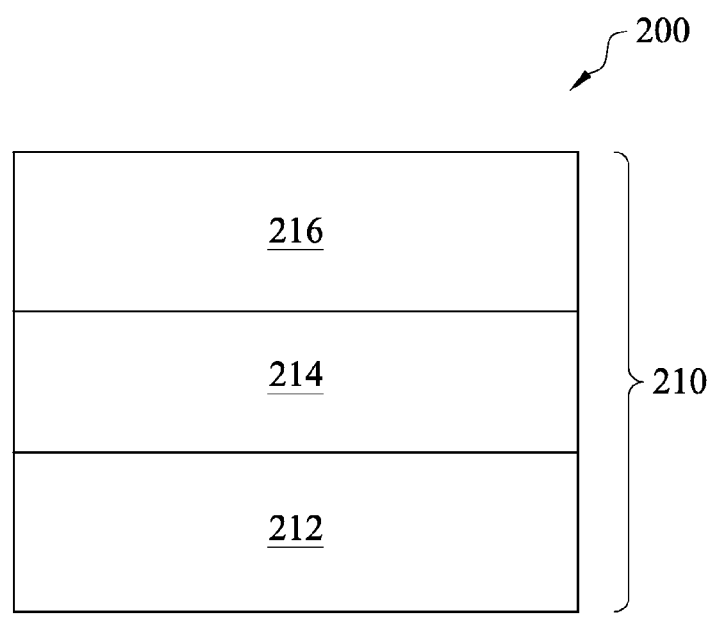
FIG. 2B is a cross-sectional view of an example FinFET device along the line A-A in FIG. 2A at fabrication stages constructed according to the method of FIG. 1.

Referring to FIGS. 1 and 2A-2B, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 416 has a second lattice constant different from the first lattice constant. In the present embodiment, the second semiconductor material layer 214 includes silicon germanium (SiGe), and both of the first and the third semiconductor material layers, 212 and 216, include silicon. In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/ or ultra-high vacuum CVD (UHV-CVD)), molecular beam epitaxy, and/or other suitable processes.

The substrate 210 may include various doped features depending on design requirements as known in the art. In some embodiment, the substrate 210 may include various doped regions depending on design requirements (e. g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

Figure 3A:
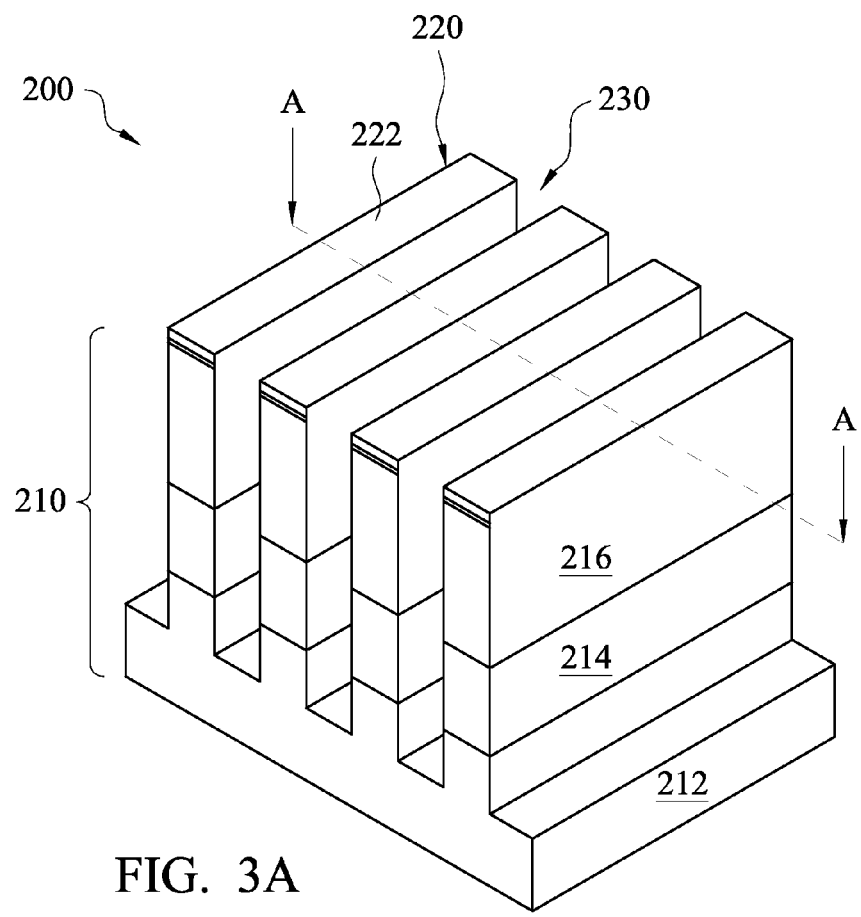
FIG. 3A is a diagrammatic perspective view of an example FinFET device undergoing processes in accordance with some embodiments.
Figure 3B:
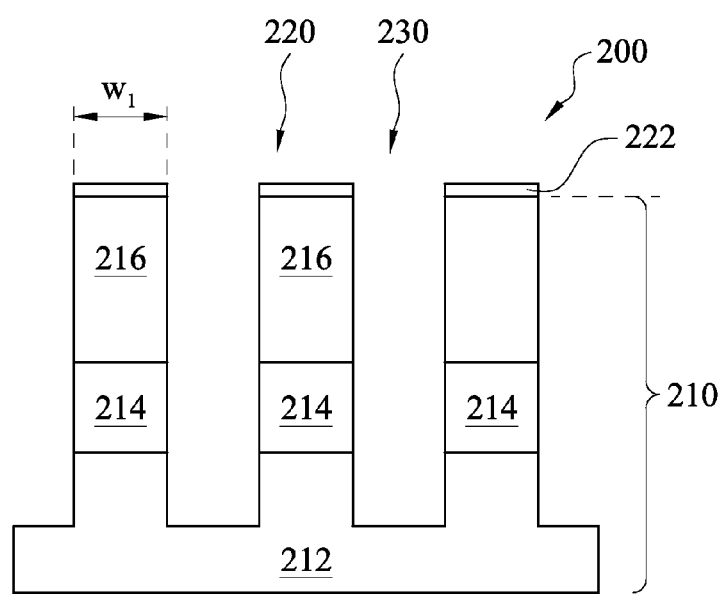
FIG. 3B is a cross-sectional view of an example FinFET device alone the line A-A in FIG. 3A at fabrication stages constructed according to the method of FIG. 1.

Referring to FIGS. 1 and 3A-3B, the method 100 proceeds to step 104 by forming first fins 220 and trenches 230 in the substrate 210. The first fin 220 has a first width $w_1$ in a range of about 4 nm to about 10 nm. In one embodiment, a patterned fin hard mask (FHM) layer 222 is formed over the substrate 210. The patterned FHM layer 222 includes silicon oxide, silicon nitride, silicon oxynitride, or any other suitable dielectric material. The patterned hard mask layer 222 may include a single material layer or multiple material layers. The patterned FHM layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned FHM layer 222.

An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

The substrate 210 is then etched through the patterned FHM layer 222 to form the first fins 220 and the trenches 230 in the substrate 210. In another embodiment, the patterned photoresist layer is directly used the patterned FHM layer 222 as an etch mask of the etch process to form the first fins 220 and the trenches 230 in the substrate 210. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching depth is controlled such that the third and the second semiconductor material layers, 216 and 214 are fully exposed but the first semiconductor material layer 212 is partially exposed in the trench 230. Thus the first fin structure 220 is formed to have the third semiconductor material layer 216 as an upper portion, the second semiconductor material layer 214 as a middle portion and the first semiconductor material layer 212 as a bottom portion.

In some embodiment, the FinFET device 200 includes an NFET device, designated with the reference numeral 200A and referred to as the NFET device 200A. The FinFET device 200 also includes a PFET device, designated with the reference numeral 200B and referred to as the PFET device 200B.

Figure 4A:
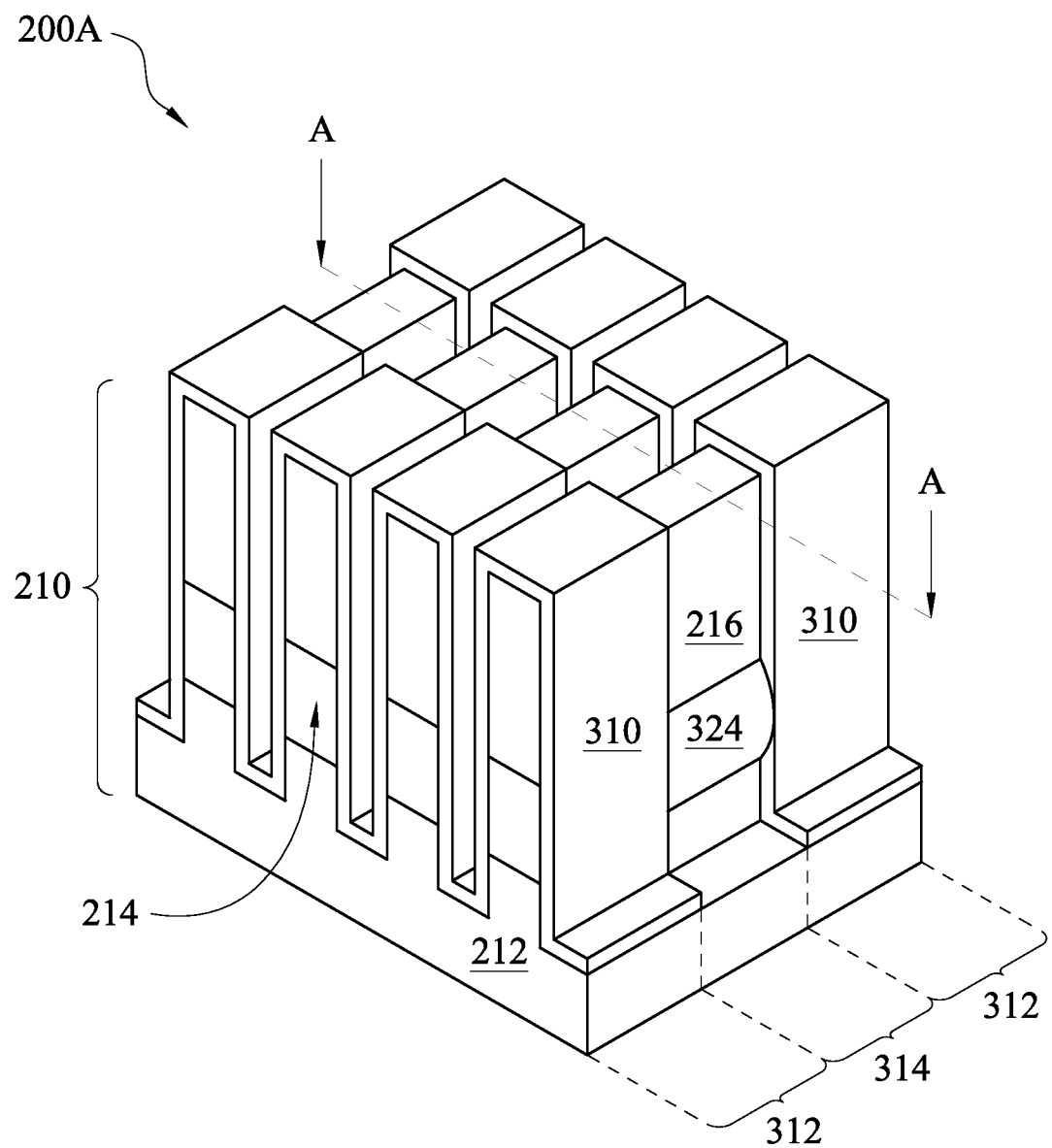
FIGS. 4A and 4B are diagrammatic perspective views of a FinFET device undergoing processes in accordance with some embodiments.
Figure 4B:
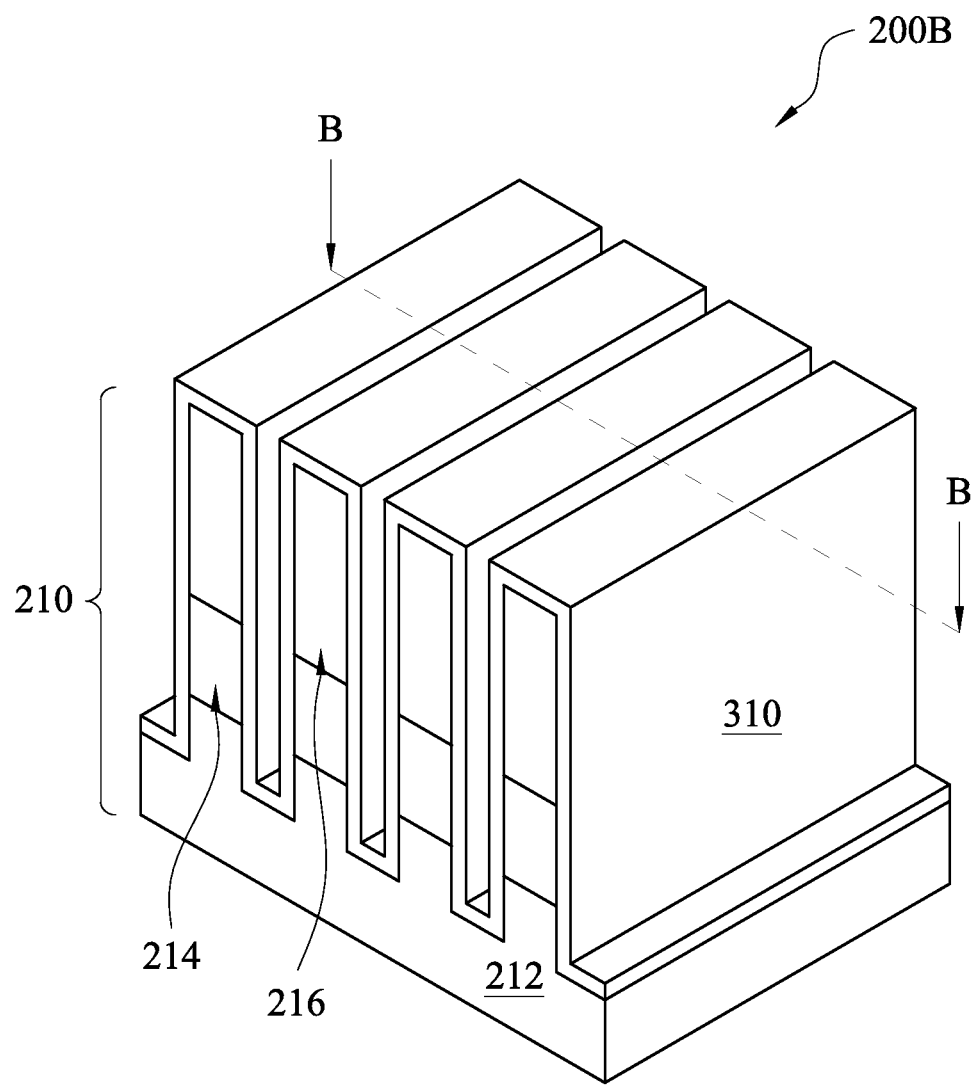

Referring to FIGS. 1 and 4A-4B, the method 100 proceeds to step 106 by forming a patterned oxidation-hardmask (OHM) 310 over the substrate 210, including wrapping a portion of the first fins 220. In the present embodiment, in the NFET 200A, the patterned OHM 310 covers a first region 312 and exposes a second region 314 in the substrate 210. In the PFET 200B, the patterned OHM 310 wraps the whole first fins 220. The patterned OHM layer 310 may include silicon oxide, silicon nitride, silicon oxynitride, or any other suitable dielectric material. The patterned OHM layer 310 may be formed by depositing a material layer by thermal oxidation, chemical CVD, ALD, or any other appropriate method, forming a patterned photoresist (resist) layer by a lithography process, and etching the material layer through the openings of the patterned photoresist layer to form the patterned OHM layer 310.

Figure 5:
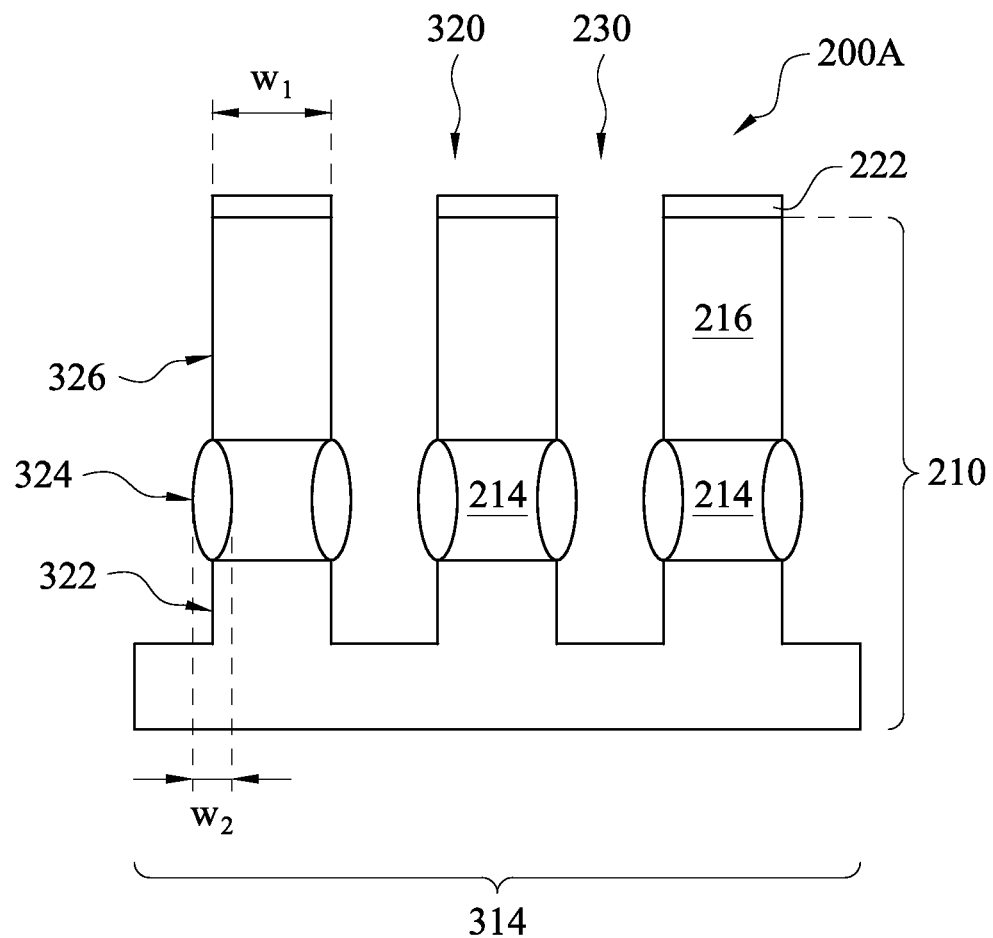
FIG. 5 is a cross-sectional view of an example FinFET device along the line A-A in FIG. 4A at fabrication stages constructed according to the method of FIG. 1.

Referring also to FIGS. 1, 4A and 5, the method 100 proceeds to step 108 by performing a thermal oxidation process to the FinFET device 200. In one embodiment, the thermal oxidation process is conducted in oxygen ambient. In another embodiment, the thermal oxidation process is conducted in a combination of steam ambient and oxygen ambient. In the second region 314 of the NFET 200A, during the thermal oxidation process, at least outer layers of the first, the second and the third semiconductor material layers, 212, 214 and 216, convert to a first, second and a third semiconductor oxide features 322, 324 and 326, respectively. While in the first region 312 of the NFET 200A, as well as entire the PFET 200B, the patterned OHM 310 prevents the first fin structure 220, to be oxidized. Therefore, the thermal oxidation process is referred to as a selective oxidation.

After the thermal oxidation process, the first fin structure 220 in the second region 324 has a different structure than those in the first region 312. For the sake of clarity to better description, the first fin structure 220 in the second region 214 (having the second semiconductor oxide feature 324) is referred to as a second fin structure 320. Thus the second fin structure 320 has the third semiconductor material layer 216 as its upper portion, the second semiconductor material layer 214, with the second semiconductor oxide feature 324 at its outer layer, as its middle portion and the first semiconductor material layer as its bottom portion.

In the present embodiment, the thermal oxidation process is controlled such that the second semiconductor material layer 214 oxidizes much faster that the first and third semiconductor material layers, 212 and 216. In another words, comparing to the second semiconductor oxide feature 324, the first and third semiconductor oxide features, 322 and 326, are quite thin. As an example, the thermal oxidation process to the FinFET device 200 is performed in a $H_2O$ reaction gas with a temperature ranging from about 400° C. to about 600° C. and under a pressure ranging from about 1 atm. to about 20 atm. After the oxidation process, a cleaning process is performed to remove the first and the third semiconductor oxide features, 322 and 326. The cleaning process may be performed using diluted hydrofluoric (DHF) acid.

In the present example, the second semiconductor oxide features 324 extends in the vertical direction with a horizontal dimension varying from the top surface to the bottom surface of the second semiconductor material layer 214. In furtherance of the present example, the horizontal dimension of the second semiconductor oxide features 324 reaches its maximum, referred to as a first width $w_1$, and decreases to close to zero when approaches to the top and bottom surfaces of the second semiconductor oxide features 324, resulting in an olive shape in a cross-sectional view. By tuning of the thermal oxidation process, selecting a composition and thickness of the second semiconductor material layer 214 and tuning the oxidation temperature, it achieves a target second width $w_2$ of the second semiconductor oxide feature 324, which applies an adequate stress to the third semiconductor material layer 216 in the first fin 220, where a gate channel is to be defined underlying a gate region, which will be described later.

In one embodiment, the second semiconductor material layer 214 includes silicon germanium ($SiGe_{x1}$) and both of the first and the third semiconductor material layers, 212 and 216, include silicon (Si). The subscript $x_1$ is a first Ge composition in atomic percent and it may be adjusted to meet a predetermined volume expansion target. In one embodiment, $x_1$ is selected in a range from about 20% to about 80%. An outer layer of the $SiGe_{x1}$ layer 214 is oxidized by the thermal oxidation process, thereby forming the silicon germanium oxide (SiGeO) feature 324. The second width $w_2$ of the SiGeO feature 324 is in a range of about 3 nm to 10 nm. A center portion of the $SiGe_{x1}$ layer 214 changes to a second Ge composition $x_2$, which is much higher than $x_1$. A size and shape of the center portion of $SiGe_{x2}$ vary with process conditions, such as thermal oxidation temperature and time. Also the second Ge composition $x_2$ in the center portion is higher than other portions, such as a top portion, a bottom portion, a left side portion and a right side portion.

Figure 6A:
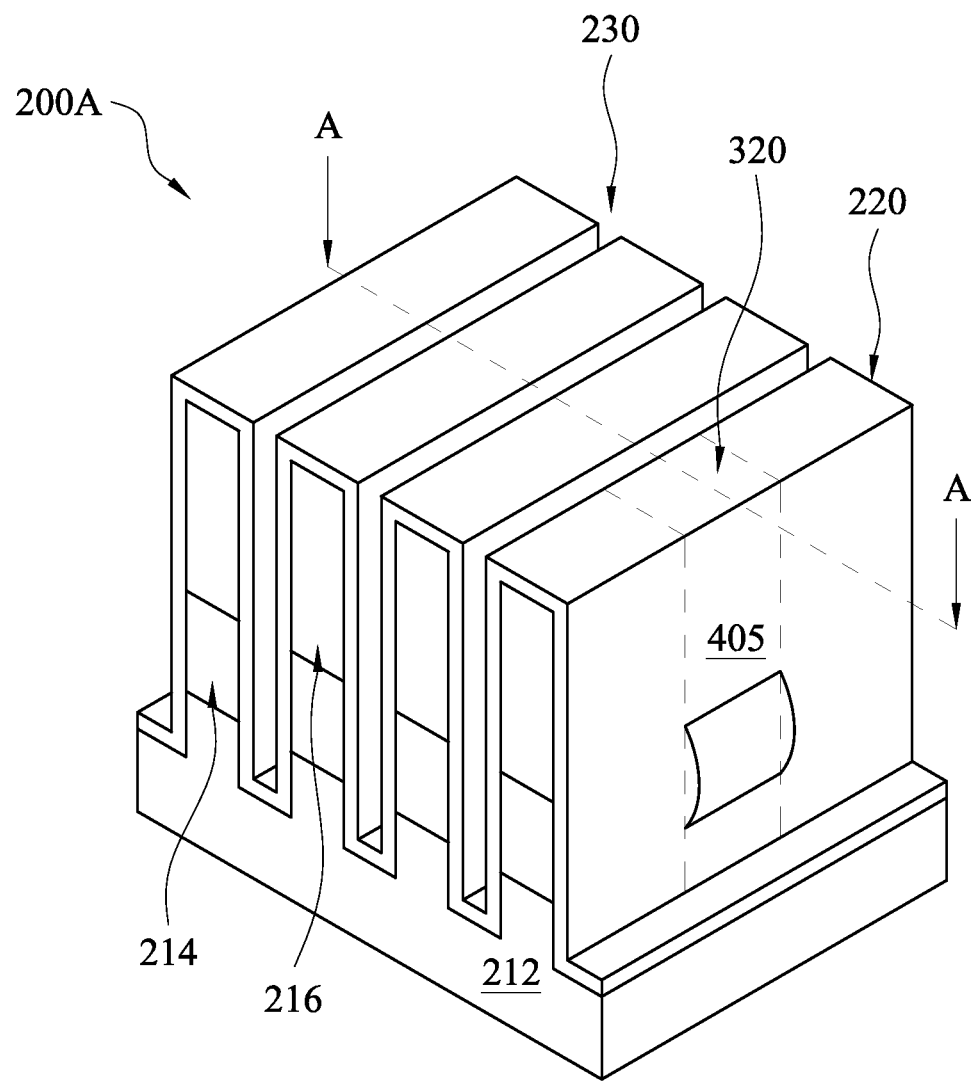
FIGS. 6A and 6B are diagrammatic perspective views of a FinFET device undergoing processes in accordance with some embodiments.
Figure 6B:
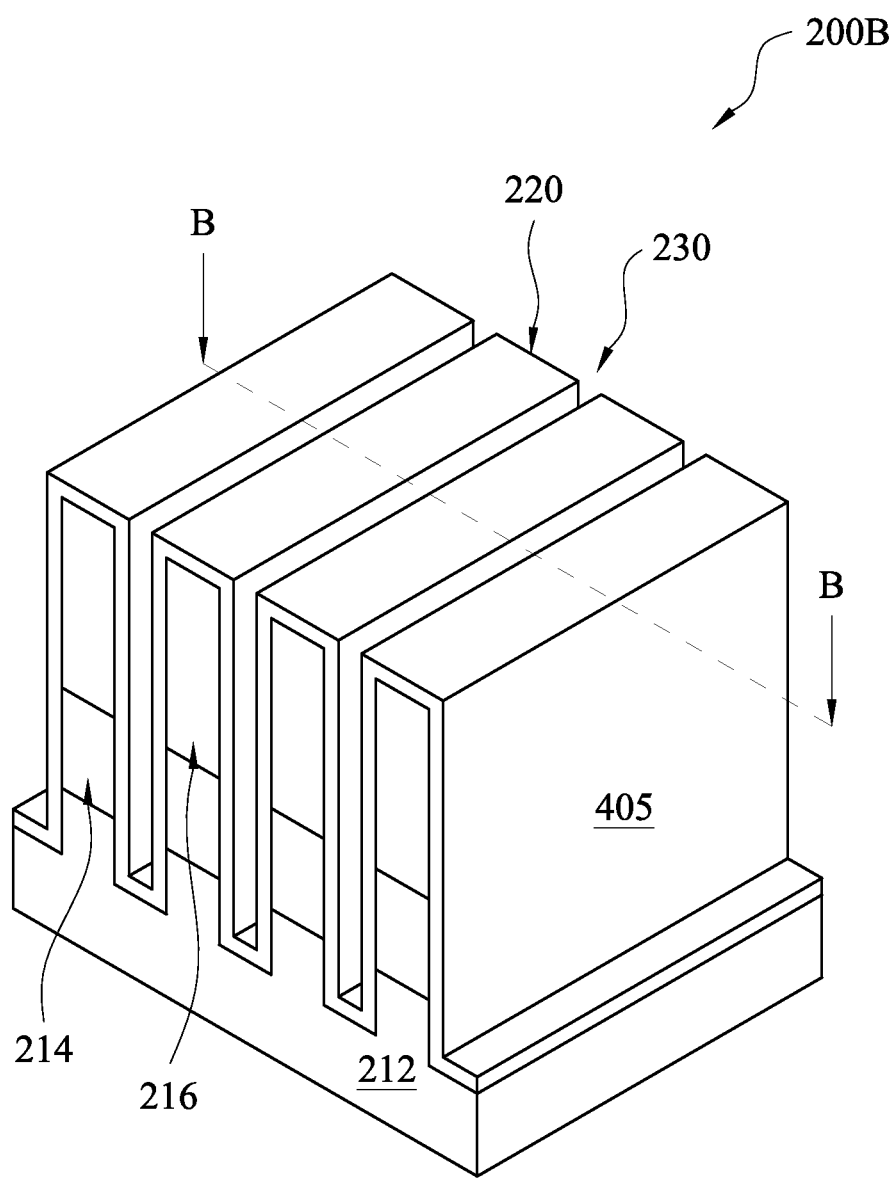

Referring to FIGS. 1 and 6A-6B, the method 100 proceeds to step 110 by depositing a liner 405 to conformably wrap over the first fin structure 220, as well as the second fin structure 320, in both of the NFET device 200A and the PFET device 200B. First, the patterned OHM layer 310 is removed by an etching process, such as a selective wet etch. In the present embodiment, the liner 405 includes silicon nitride, silicon oxynitride, aluminum oxide, or other suitable materials. The liner 405 has a first thickness in a range of about 20 Å to about 60 Å. In the present embodiment, the liner 405 is deposited by ALD to achieve adequate film coverage of wrapping over the first fin structure 220. Alternatively, the liner 405 may be deposited by CVD, physical vapor deposition (PVD), or other suitable techniques. In one embodiment, the liner 405 is formed by two layers, a first layer 404 and a second layer 404 deposited over the first layer 404, not shown. The first layer 402 may include Si and silicon oxynitride and the second layer 404 may include silicon nitride and aluminum oxide. The first layer 402 has a second thickness in a range of about 10 Å to about 30 Å and the second layer 404 has a third thickness in a range of about 20 Å to about 60 Å. In the present embodiment, the liner 405 is designed to be a buffer layer to prevent the second semiconductor material layer 214 be oxidized further in the downstream or later processed and a barrier of out-diffusion of the second semiconductor material layer 214, which will be described in detail below.

Figure 7A:
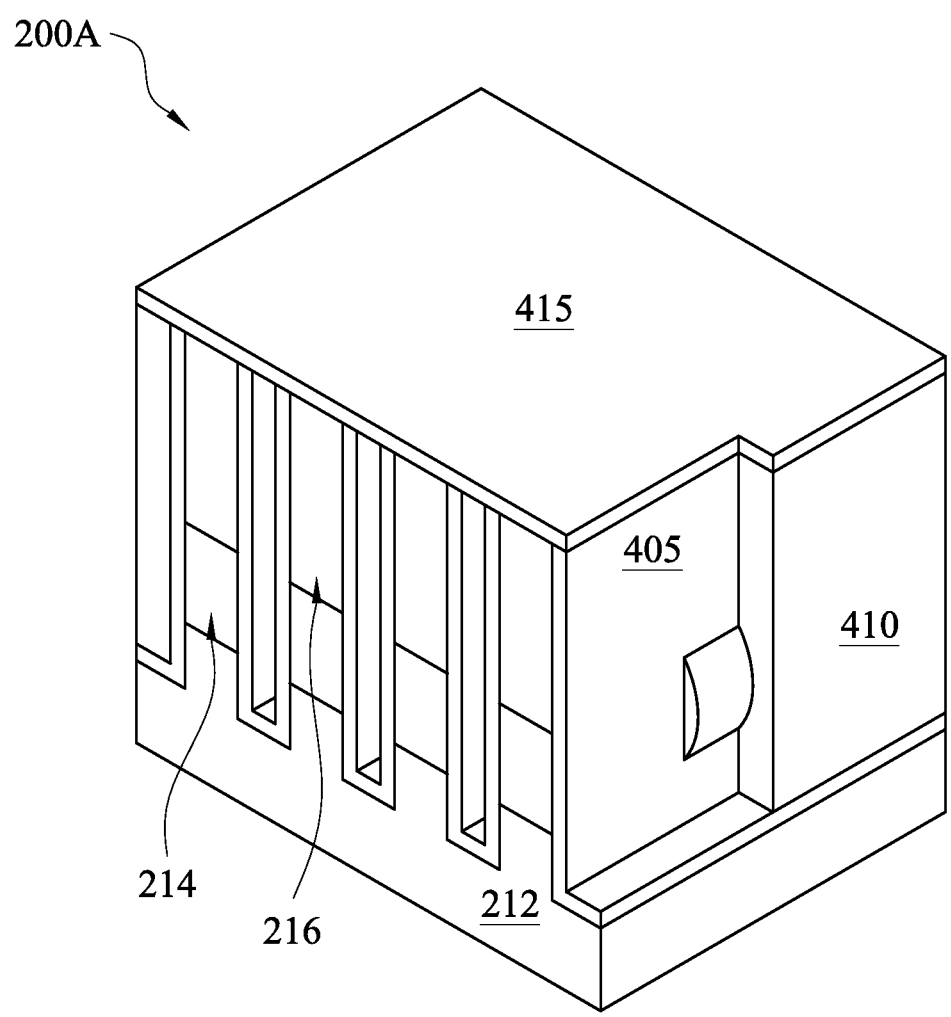
FIGS. 7A and 7B are diagrammatic perspective views of a FinFET device undergoing processes in accordance with some embodiments.
Figure 7B:
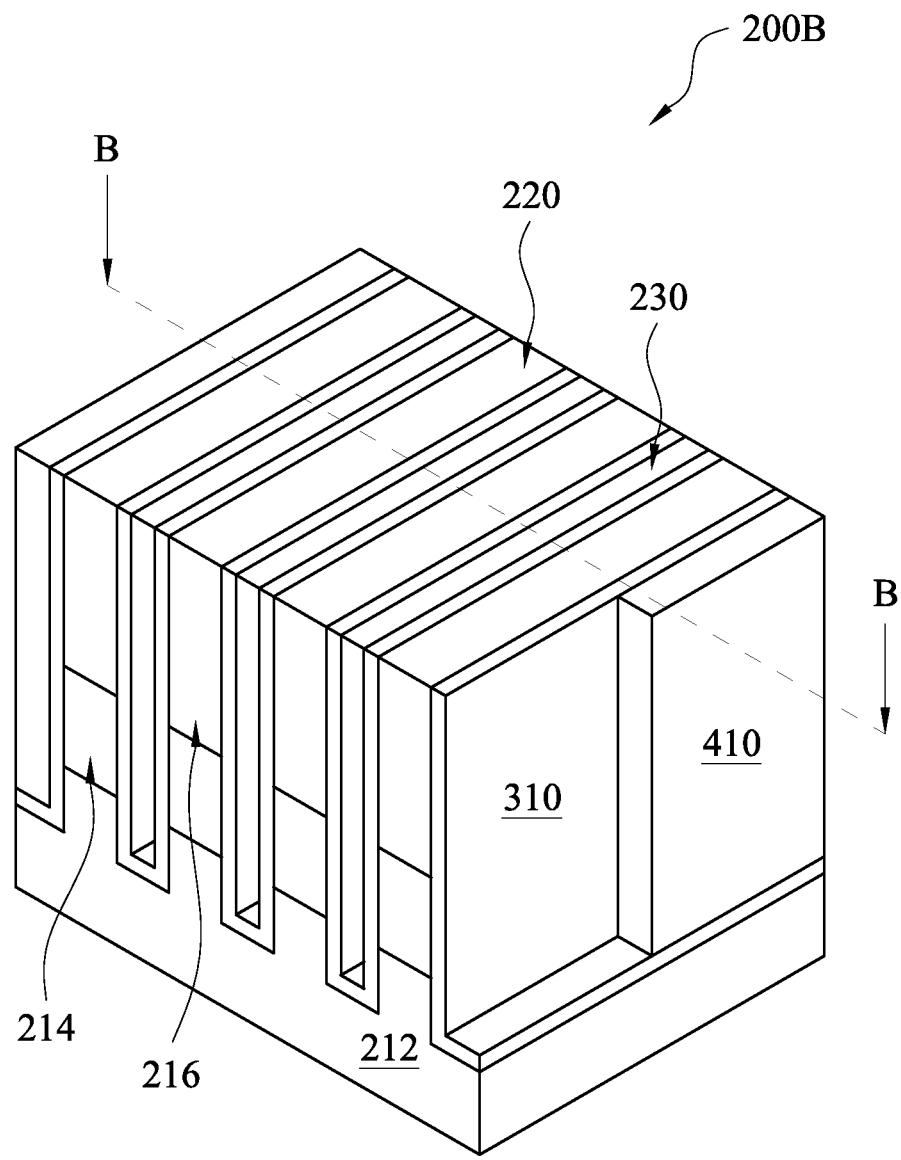

Referring to FIGS. 1 and 7A-7B, the method 100 proceeds to step 112 by depositing a dielectric layer 410 over the substrate 210, including filling in the trench 230, in both of the NFET 200A and the PFET 200B. The dielectric layer 410 may include silicon oxide, silicon nitride, silicon oxynitride, spin-on-glass, spin-on-polymer, or other suitable materials, or combinations thereof. The dielectric layer 410 may be deposited by CVD, physical vapor deposition (PVD), ALD, thermal oxidation, spin-on coating, or other suitable techniques, or a combination thereof. As has been mentioned previously, having the liner 405 cover the first fin structure 220 and the second fin structure 320, it provides a buffer to adverse impacts induced during the formation of the dielectric layer 410, such as in thermal curing process for the dielectric layer 410.

Referring also to FIGS. 1 and 7A-7B, the method 100 proceeds to step 114 by forming a patterned HM layer 415 over the substrate 210 to cover the NFET 200A and leave the PFET 200B be un-covered. The patterned HM layer 415 may include silicon nitride, silicon oxynitride, silicon carbide, or any other suitable dielectric material. The patterned HM layer 415 may be formed similarly to forming of the patterned OHM layer 310 in step 106.

Figure 8A:
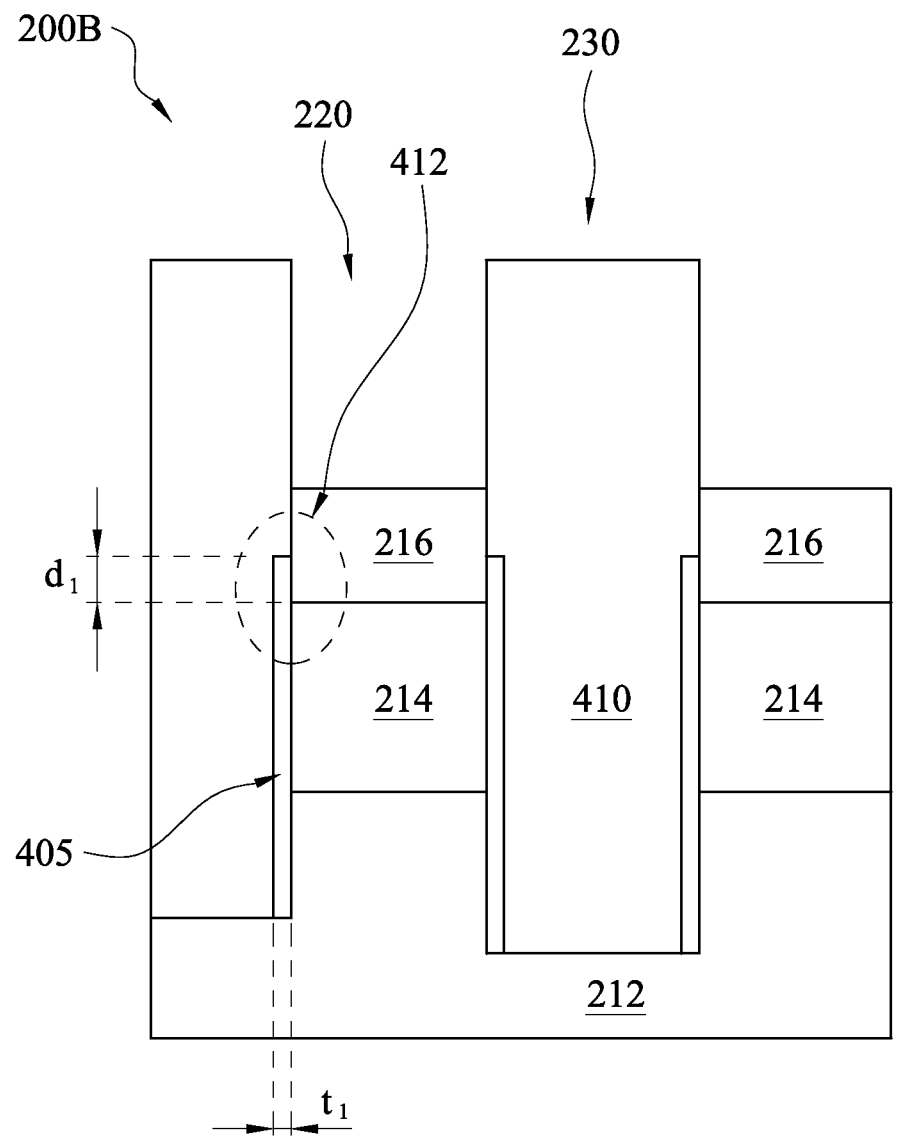
FIGS. 8A-8B and 9 are cross-sectional views of an example FinFET device along the line B-B in FIG. 7B at fabrication stages constructed according to the method of FIG. 1.

Referring to FIGS. 1 and 8A, the method 100 proceeds to step 116 by recessing the liner 405 and the third semiconductor material layer 216 in the first fin structure 220 in the PFET 200B, while the NFET 200A is protected by the patterned HM layer 415. The liner 405 and the third semiconductor material layer 216 are recessed by proper etching processes, such as a selective wet etch, a selective dry etch, or a combination thereof. Alternatively, the liner 405 and the third semiconductor material layer 216 are recessed through a patterned photoresist layer formed over the PFET 200B. In present embodiment, the recessing processes are controlled to have a top surface of the remaining liner 405 below the remaining third semiconductor material layer 216 but above the second semiconductor material layer 214 with a first distance $d_1$. As has been mentioned previously, the first distance $d_1$ is designed to be adequate to retard an upwards-out-diffusion of the second semiconductor material 214, along an interface 412 of the dielectric layer 410 and the third semiconductor material layer 216, into the upper portion of the first fin structures, where a gate channel will be formed later. For example, the first distance $d_1$ is adequate to retard the upwards out-diffusion of Ge in the SiGe layer 214 along the interface 412 of the dielectric layer 410 and the Si layer 216. In one embodiment, the first distance $d_1$ is in a range of about 2 nm to about 10 nm.

Figure 8B:
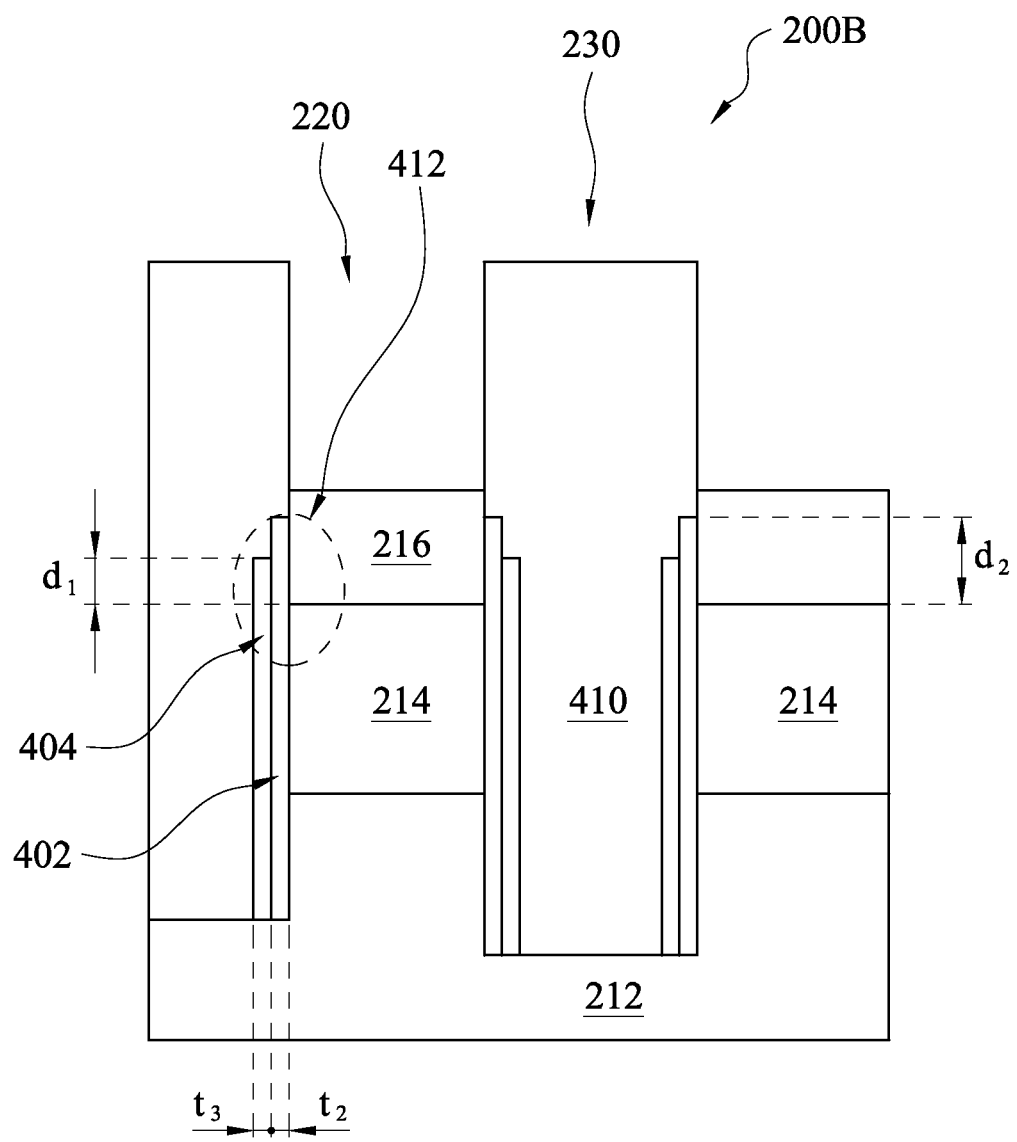

In another embodiment, as shown in FIG. 8B, where the liner is formed by the first layer 402 and the second layer 404, the first layer 402 is recessed to have a top surface of the remaining first layer 402 above the second semiconductor material layer 214 with a second distance $d_2$ and the second layer 404 is recessed to have a top surface of the remaining second layer 404 above the second semiconductor material layer 214 with the first distance $d_1$. The second distance $d_2$ is larger than the first distance $d_1$. In one embodiment, the second distance $d_2$ is in a range of about 5 nm to about 20 nm. The double layers of the liner will enhance to retard an out-diffusion of the second semiconductor material 214 along the interface 412 of the dielectric layer 410 and the third semiconductor material layer 216.

Figure 9:
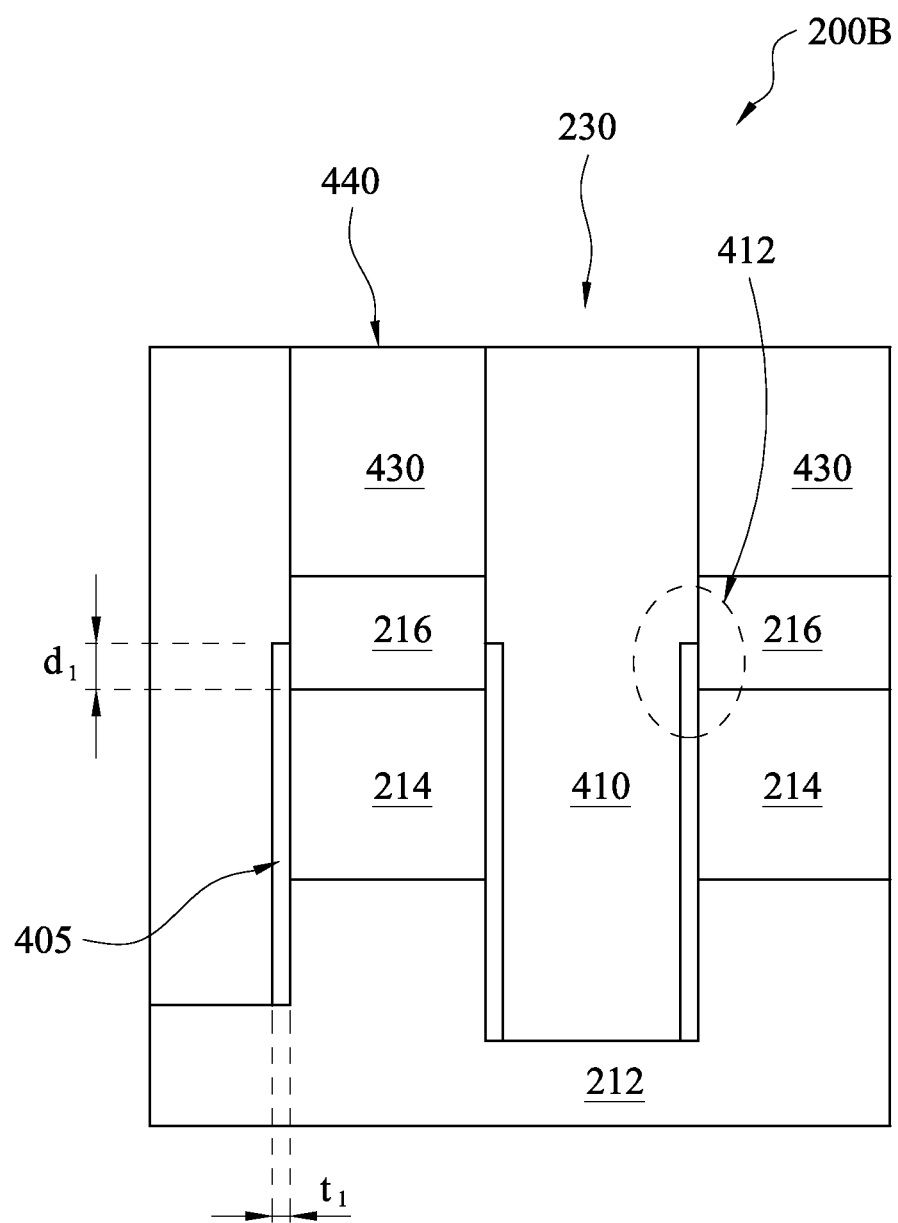

Referring to FIGS. 1, 7A and 9, the method 100 proceeds to step 118 by depositing a fourth semiconductor material layer 430 over the recessed third semiconductor material layer 216 to form a third fin structure 440 in the PFET device 200B, while the NFET 200A is protected by the patterned HM layer 415. The fourth semiconductor material layer 430 may be deposited by epitaxial growth. The epitaxial process may include CVD deposition techniques, molecular beam epitaxy, and/or other suitable processes. The fourth semiconductor material layer 430 may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the fourth semiconductor material layer 430 is SiGe. Thus the third fin structure 440 is formed to have the fourth semiconductor material layer 430 as its upper portion, the third semiconductor material layer 216 as its upper middle portion, the second semiconductor material layer 214 as its lower middle portion and the first semiconductor material layer 212 as its bottom portion.

A CMP process may be performed thereafter to remove excessive the fourth semiconductor material layer 430 and planarize the top surface of the PFET device 200B. The HM layer 415 in the NFET device 200A is removed by a proper etching process, such as a wet etch, a dry etch, or a combination thereof.

Referring to FIGS. 1 and 10A-10E, the method 100 proceeds to step 120 by recessing the liner 405 in the NFET device 200A and recessing the dielectric layer in both of the NFET device 200A and the PFET device 200B. First, the patterned HM layer 415 is removed from the NFET device 200A by a proper etching process, such as a selective wet etch, or a selective dry etch. The liner 405 is then be recessed by a proper etching process, such as a selective wet etch, a selective dry etch, or a combination thereof. In present embodiment, the recessing processes are controlled to have a top surface of the remaining liner 405 below the remaining third semiconductor material layer 216 but above the second semiconductor material layer 214 with the first distance $d_1$. In another embodiment, where the liner is formed by the first layer 402 and the second layer 404, the first layer 402 is recessed to have a top surface of the remaining second layer 402 above the second semiconductor material layer 214 with the second distance $d_2$.

The dielectric layer 410 is then recessed in both of the NFET device 200A and the PFET device 200B to expose the upper portion of the first fin structure 220 (in the NFET device 200A) and the upper portion of the third fin structure 440 (in the PFET device 200B). In the present embodiment, the recessing processes are controlled to have a top surface of the recessed dielectric layer 410 above the top surface of the liner 405 with a third distance $d_3$. In the present embodiment, the third distance $d_3$ is designed to be adequate to keep the liner 405 away from an upper portion of the first, the second and the third fin structures, where a gate region will be formed later, to avoid adverse impacts of the liner 405 to the gate region, such as fixed charges in the liner 405. In one embodiment, the third distance $d_3$ is in a range of about 3 nm to about 10 nm. Alternatively, where the liner is formed by the first liner 402 and the second liner 404, the top surface of the recessed dielectric layer 410 is above the top surface of the second layer 404 with the third distance $d_3$. The top surface of the first layer 402 is at same level or below the top surface of the recessed dielectric layer 410.

In one embodiment, the recessed dielectric layer 410 in the trench 230 forms shallow trench isolation (STI) features.

Figure 10A:
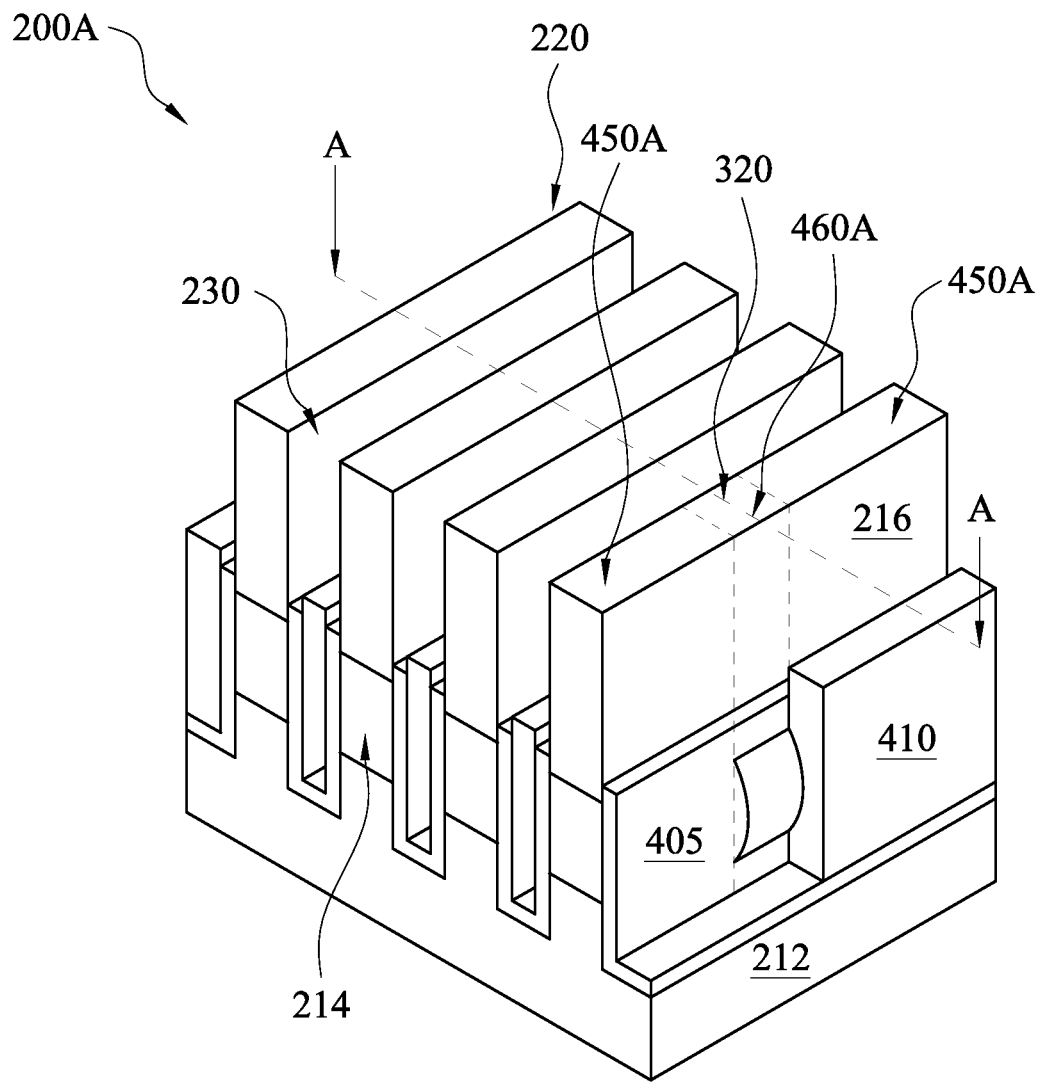
FIGS. 10A and 10B are diagrammatic perspective views of a FinFET device undergoing processes in accordance with some embodiments.
Figure 10B:
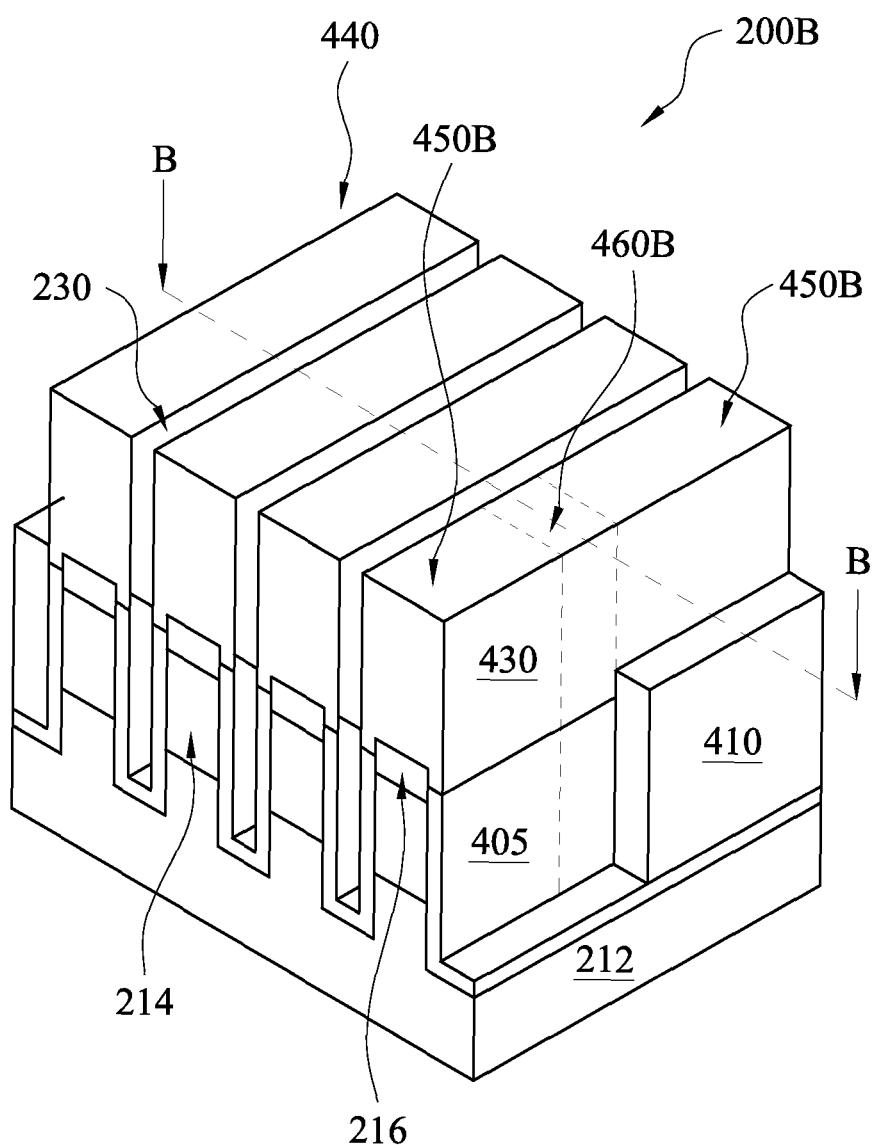
Figure 10C:
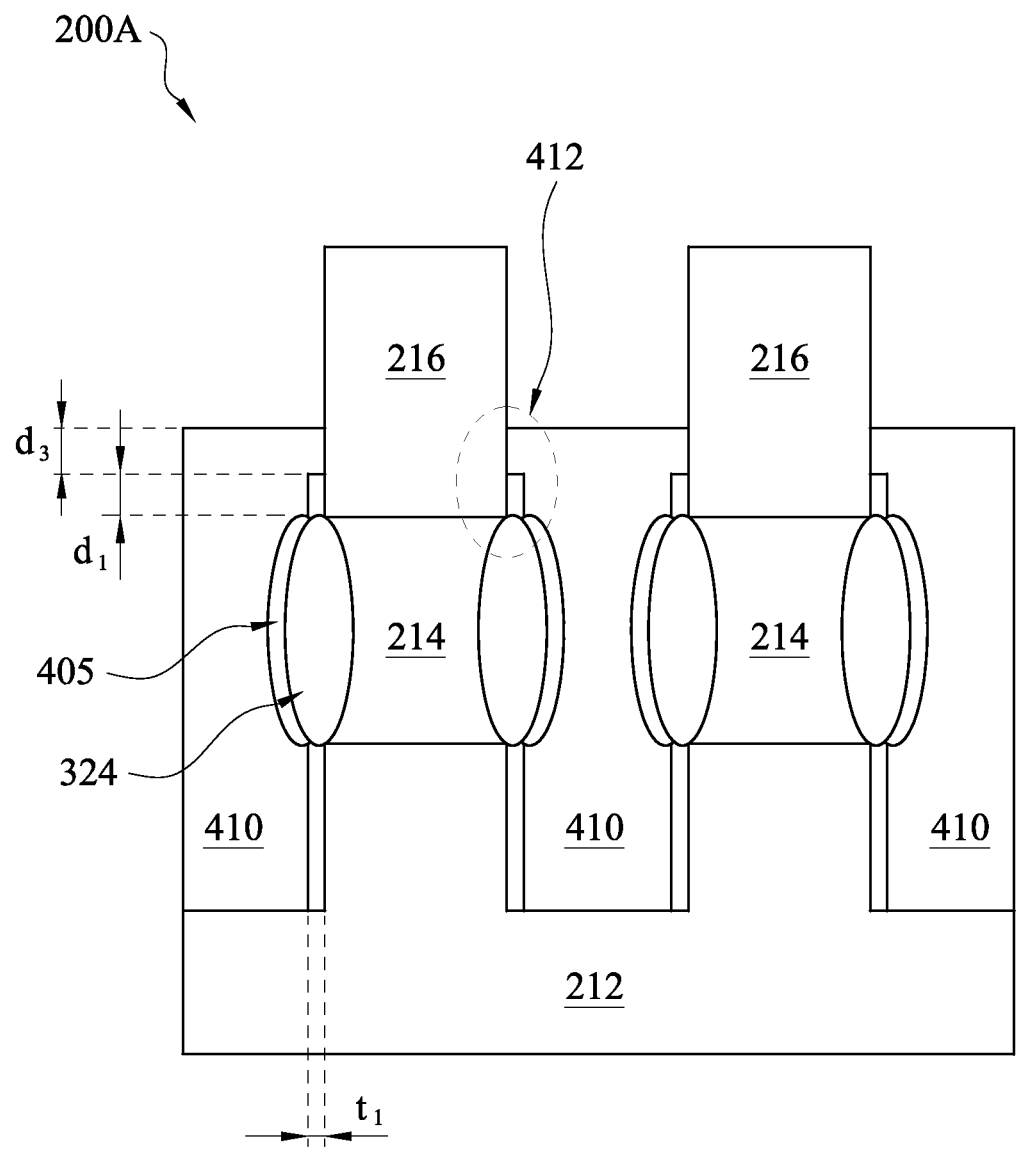
FIGS. 10C and 10D are cross-sectional views of an example FinFET device along the line A-A in FIG. 10A at fabrication stages constructed according to the method of FIG. 1.
Figure 10D:
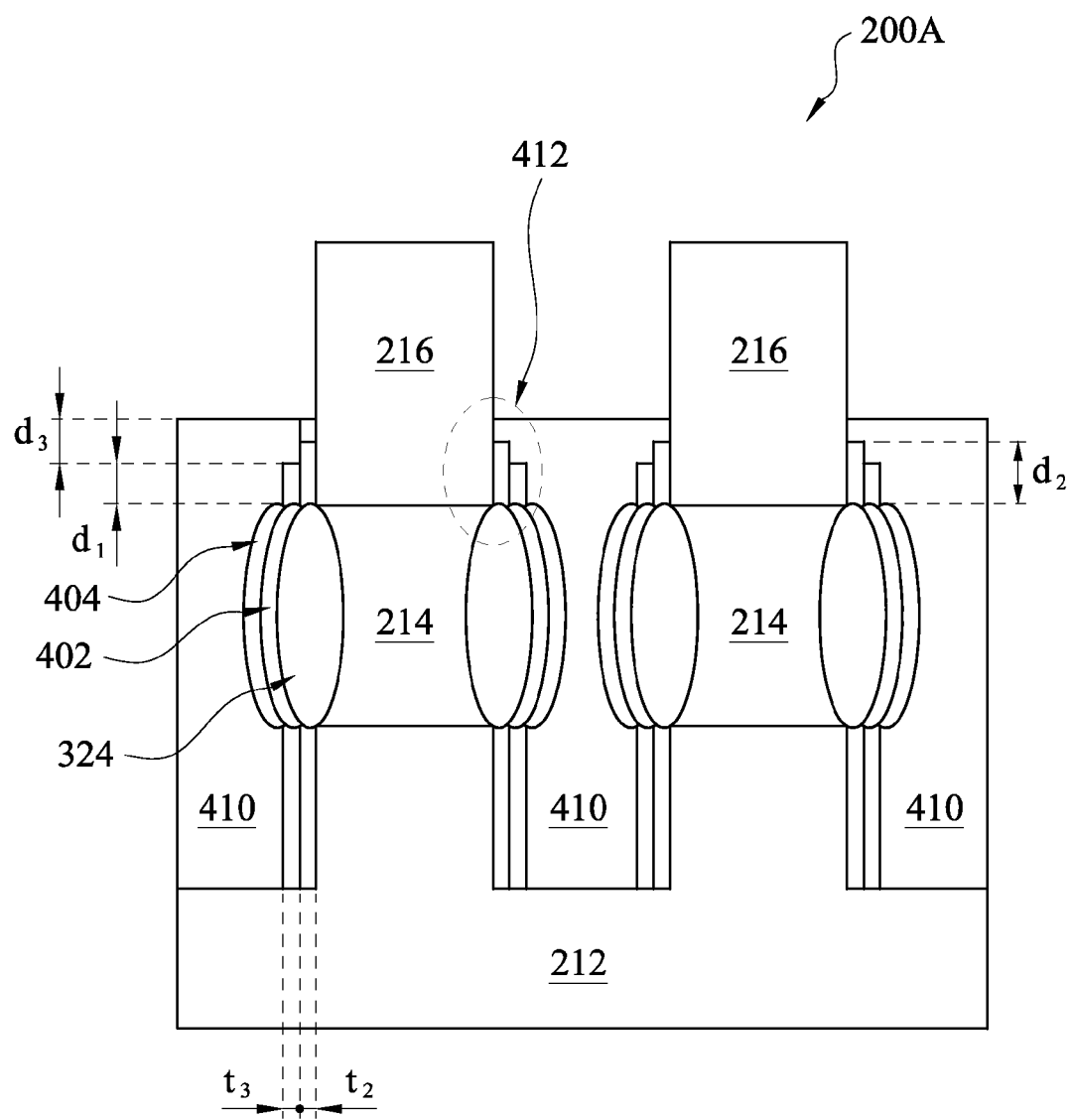
Figure 10E:
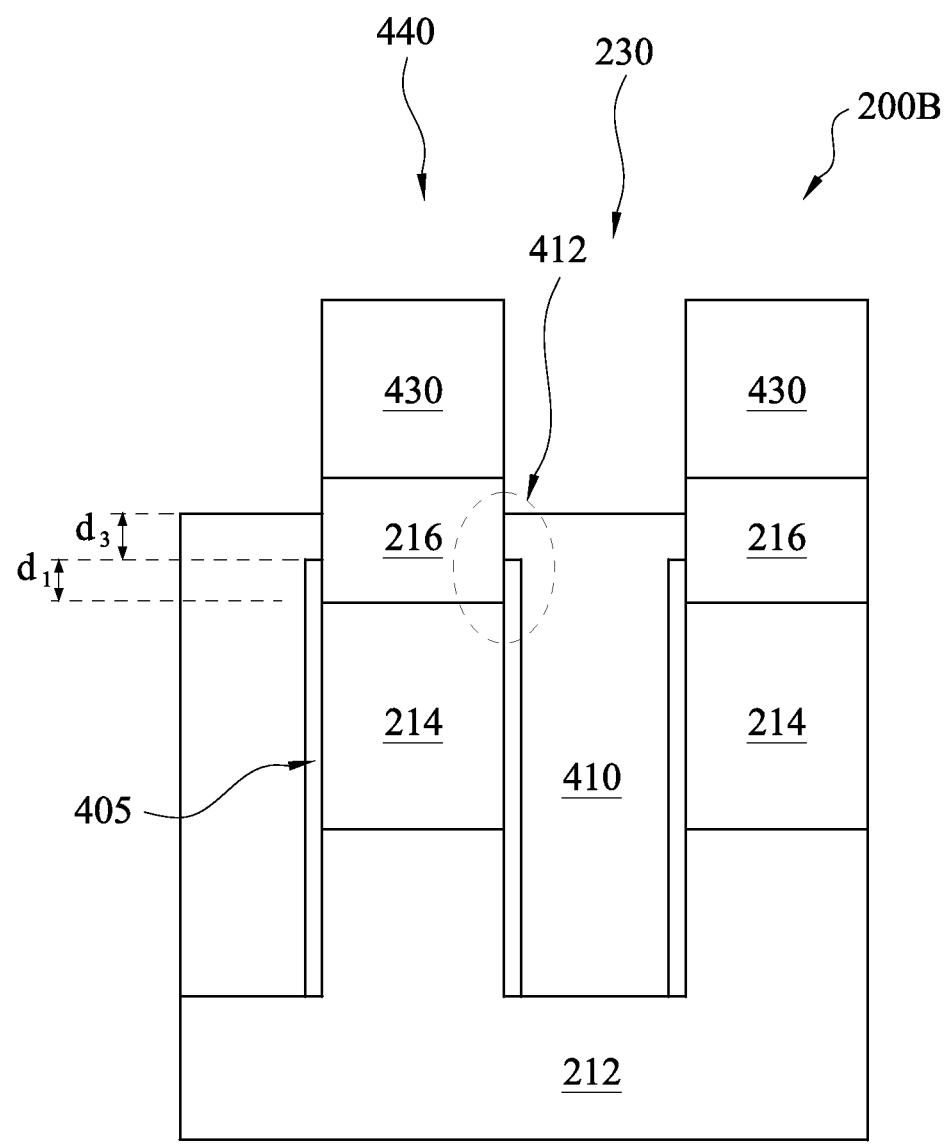
FIG. 10E is a cross-sectional view of an example FinFET device along the line B-B in FIG. 10B at fabrication stages constructed according to the method of FIG. 1.

Referring also to FIGS. 10A and 10B, in some embodiments, the first, the second and the third fin structures, 220, 320 and 440, include source/drain (S/D) regions 450 and gate regions 460. In furtherance of the embodiment, one of the S/D regions 450 is a source region, and another of the S/D regions 450 is a drain region. The S/D regions 450 are separated by the gate region 460. For the sake of clarity to better description, the S/D regions and the gate regions in the NFET device 200A are referred to as a first S/D regions 450A and a first gate regions 460A; the S/D regions and the gate regions in the PFET device 200B are referred to as a second S/D regions 450B and a second gate regions 460B.

In one embodiment, the first S/D regions 450A locates in a portion of the first fin structure 220, separated by the first gate region 460 locating in a portion of the second fin structure 320. In the PFET device 200B, the third fin structure 440 includes the second S/D regions 450B, separated by the second gate region 460B.

Figure 11A:
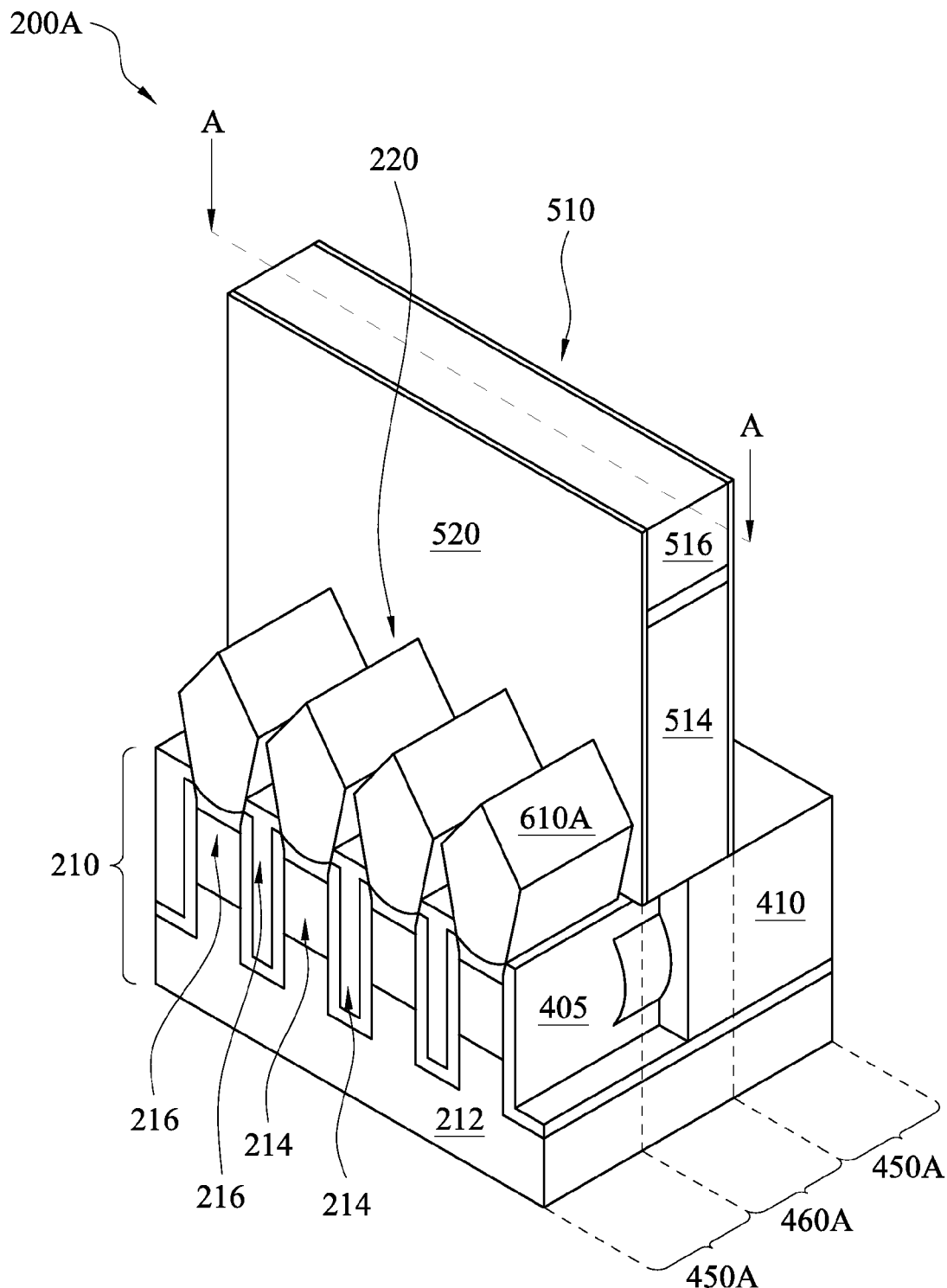
FIGS. 11A and 11B are diagrammatic perspective views of a FinFET device undergoing processes in accordance with some embodiments.
Figure 11B:
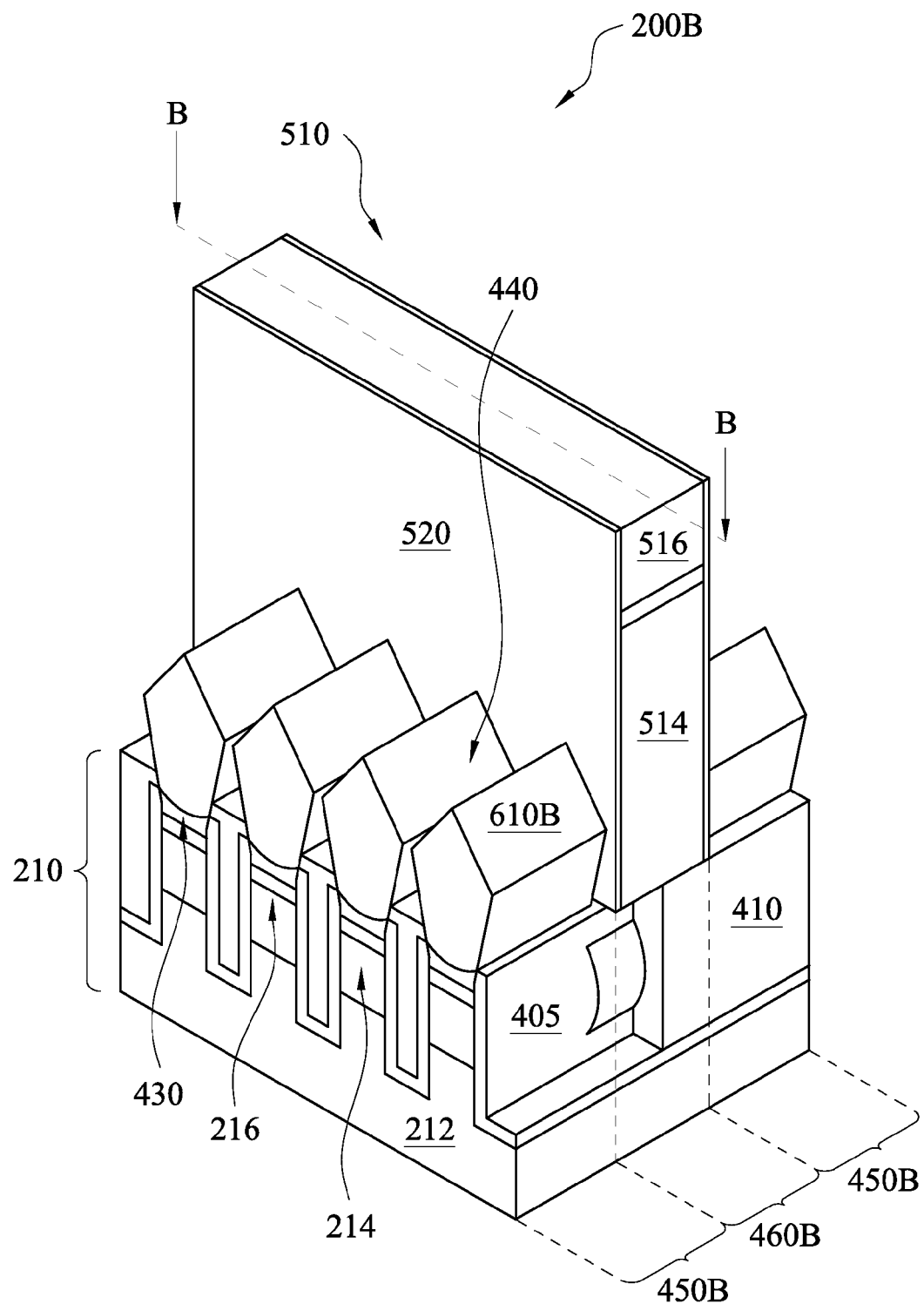

Referring to FIGS. 1 and 11A-11B, the method 100 proceeds to step 122 by forming a gate stack 510 and sidewall spacers 520 on sidewalls of the gate stack 510, in the first and second gate regions, 460A and 460B. In one embodiment using a gate-last process, the gate stack 510 is a dummy gate and will be replaced by the final gate stack at a subsequent stage. Particularly, the dummy gate stacks 510 are to be replaced later by a high-k dielectric layer (HK) and metal gate electrode (MG) after high thermal temperature processes, such as thermal annealing for S/D activation during the sources/drains formation. The dummy gate stack 510 is formed on the substrate 210 and is partially disposed over the second fin structure 320 in the first gate region 460A and the third fin structure 440 in the second gate region 460B. In one embodiment, the dummy gate stack 510 includes a dielectric layer 512, an electrode layer 514 and a gate hard mask (GHM) 516. The dummy gate stack 510 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 512 includes silicon oxide. Alternatively or additionally, the dielectric layer 512 may include silicon nitride, a high-k dielectric material or other suitable material. The electrode layer 514 may include polycrystalline silicon (polysilicon). The GHM 516 includes a suitable dielectric material, such as silicon nitride, silicon oxynitride or silicon carbide. The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Referring again to FIGS. 1 and 11A-11B, the method 100 proceeds to step 124 by forming a first S/D features 610A in the first S/D regions 450 A and a second S/D features 610B in the second S/D regions 450B. In one embodiment, the first S/D features 610A is formed by recessing a portion of the upper portion of the first fin 220 in the first S/D region 450A and the second S/D features 610B is formed by recessing a portion of the upper portion of the third fin 440 in the second S/D region 450B. In one embodiment, the first fin structure 220 and the third fin structure 440 are recessed in one etching process. In another embodiment, the first fin structure 220 and the third fin structure 440 are recessed in two different etching processes. In present embodiment, for gaining process integration flexibility, the recessing process is controlled to have a portion of the third semiconductor material layer 216 remain in the first fin structure 220 and have a portion of the fourth semiconductor material layer 430 remain in the third fin structure 440.

The first S/D features 610A and the second S/D features 610B are then epitaxially grow on the recessed first fin structure 220 in the first S/D region 450A and the recessed third fin structure 440 in the second S/D region 450B. The first and the second S/D features, 610A and 610B, include Ge, Si, GaAs, AlGaAs, SiGe, GaAsP, or other suitable material. The first and the second S/D features, 610A and 610B, may be formed by one or more epitaxy or epitaxial (epi) processes. The first and the second S/D features, 610A and 610B, may also be doped, such as being in-situ doped during the epi processes. Alternatively, the first and the second S/D features, 610A and 610B, are not in-situ doped and implantation processes (i.e., a junction implant process) are performed to dope the first and the second S/D features, 610A and 610B.

In one embodiment, the first S/D features 610A is formed by the epitaxially grown Si layer doped with carbon to form $Si:C_z$ as a lower portion of the first S/D features 610A and the epitaxial grown Si layer doped with phosphorous to form Si:P as an upper portion of the first S/D features 610A, where z is carbon composition in atomic percent. In one embodiment, z is in a range of about 0.5% to about 1.5%. The $Si:C_z$ has a thickness, which is in a range of about 5 nm to about 15 nm. The Si:P has a thickness, which is in a range of about 20 nm to 35 nm.

In another embodiment, the second S/D features 610B is formed by the epitaxially grown SiGe layer doped with boron to form $SiGe_\alpha B$, where α is germanium composition in atomic percent. In one embodiment, α is in a range of about 60% to about 100%.

Figure 12A:
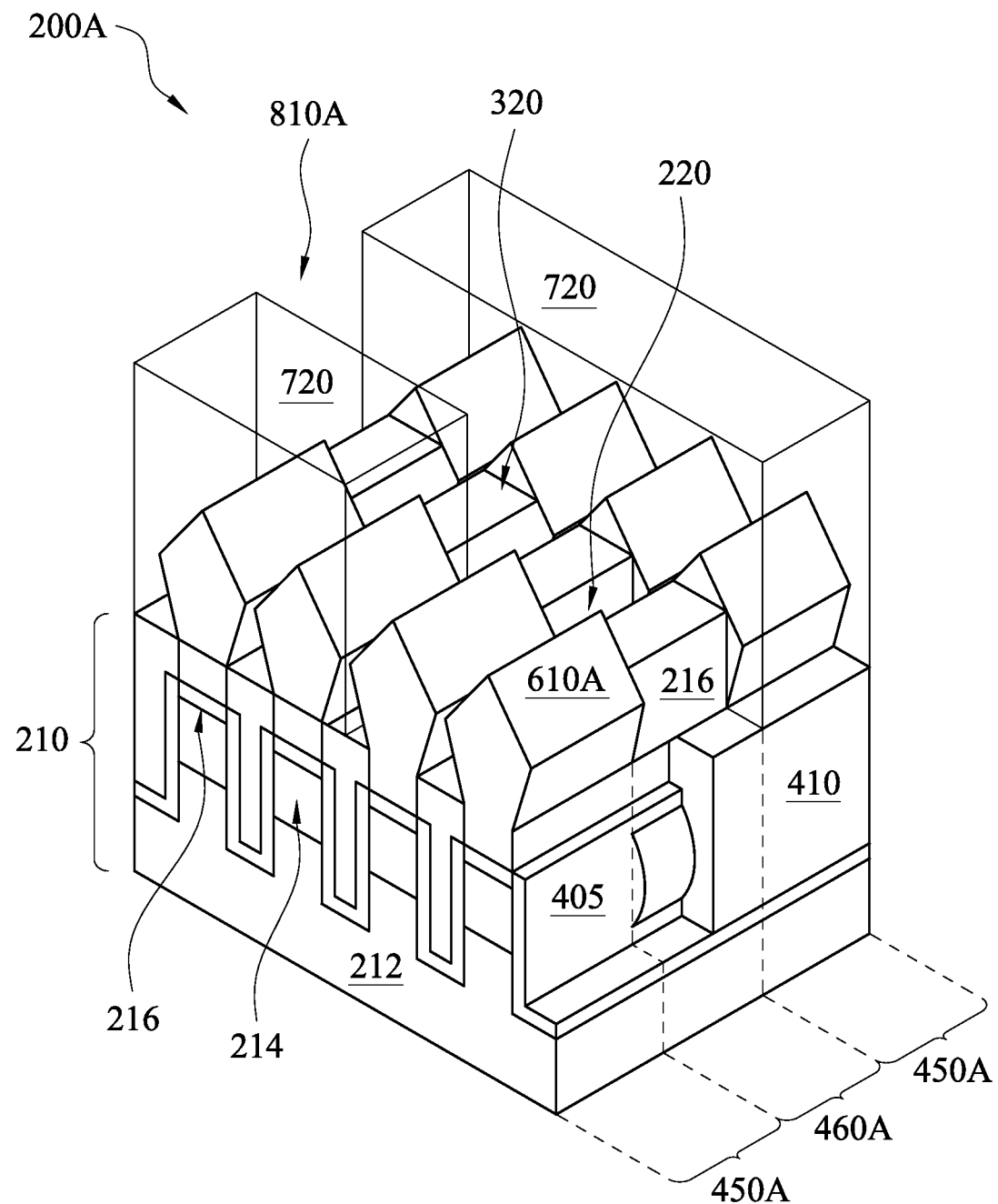
FIGS. 12A and 12B are diagrammatic perspective views of a FinFET device undergoing processes in accordance with some embodiments.
Figure 12B:
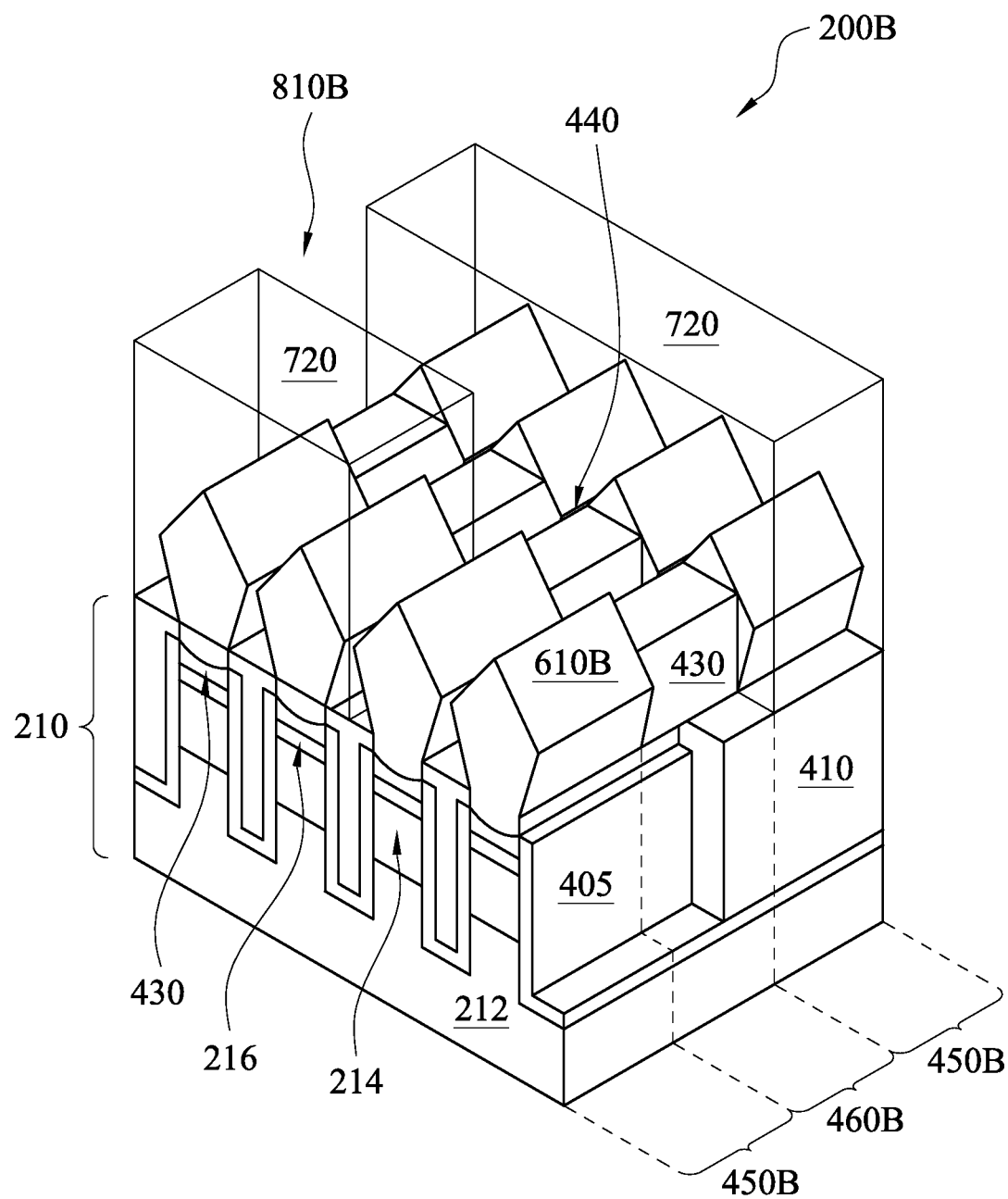
Figure 13A:
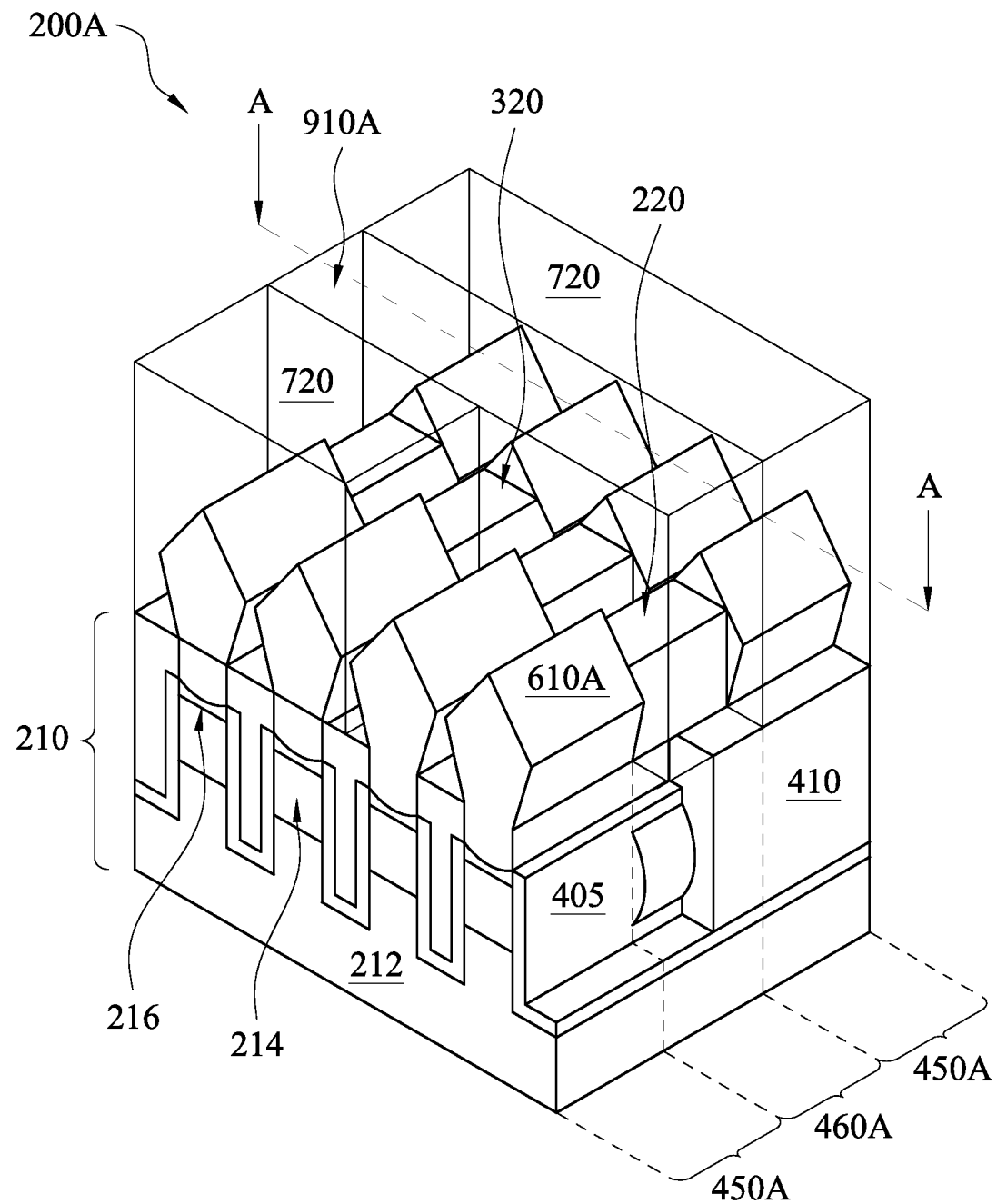
FIGS. 13A and 13B are diagrammatic perspective views of a FinFET device undergoing processes in accordance with some embodiments.
Figure 13B:
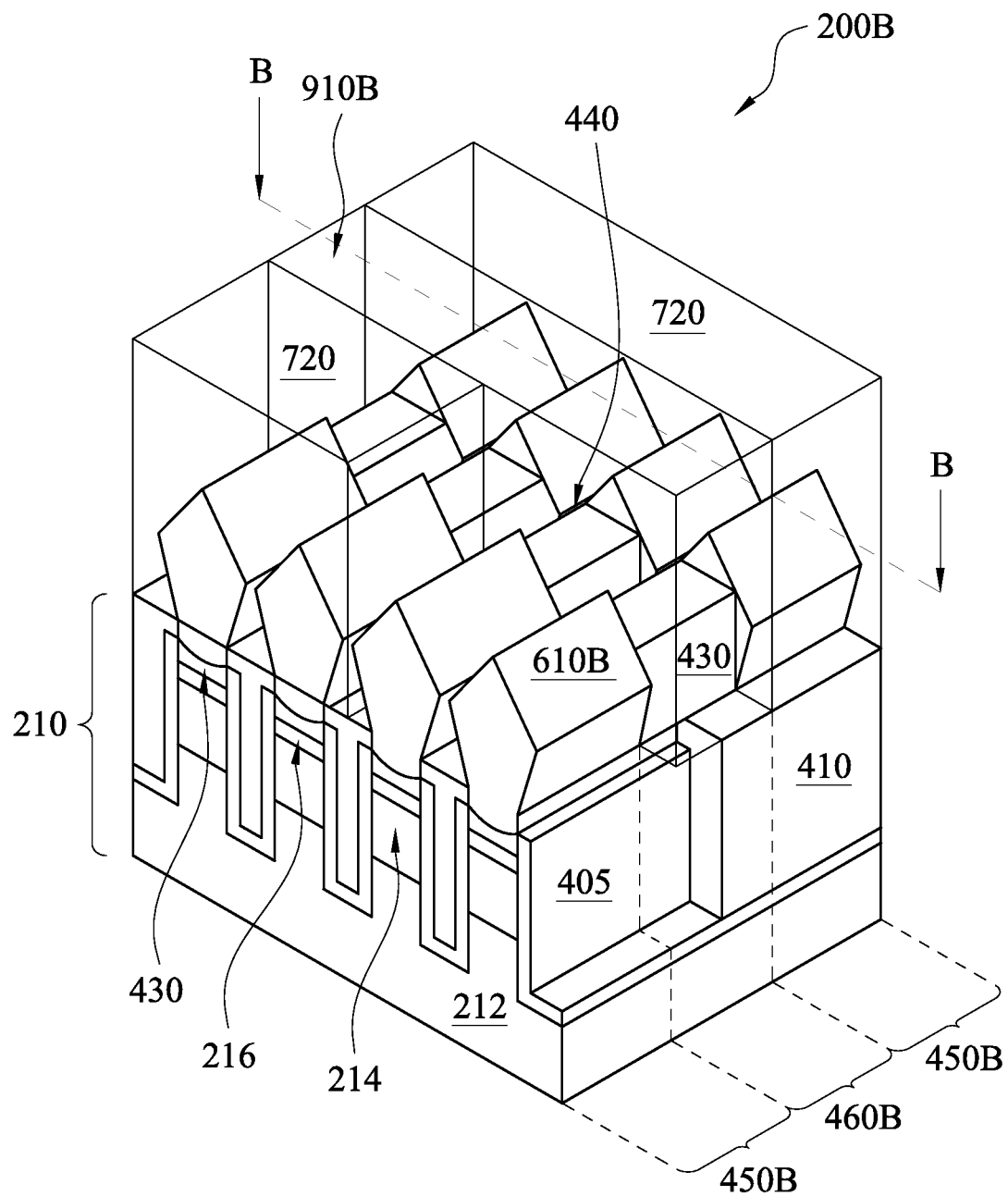
Figure 13C:
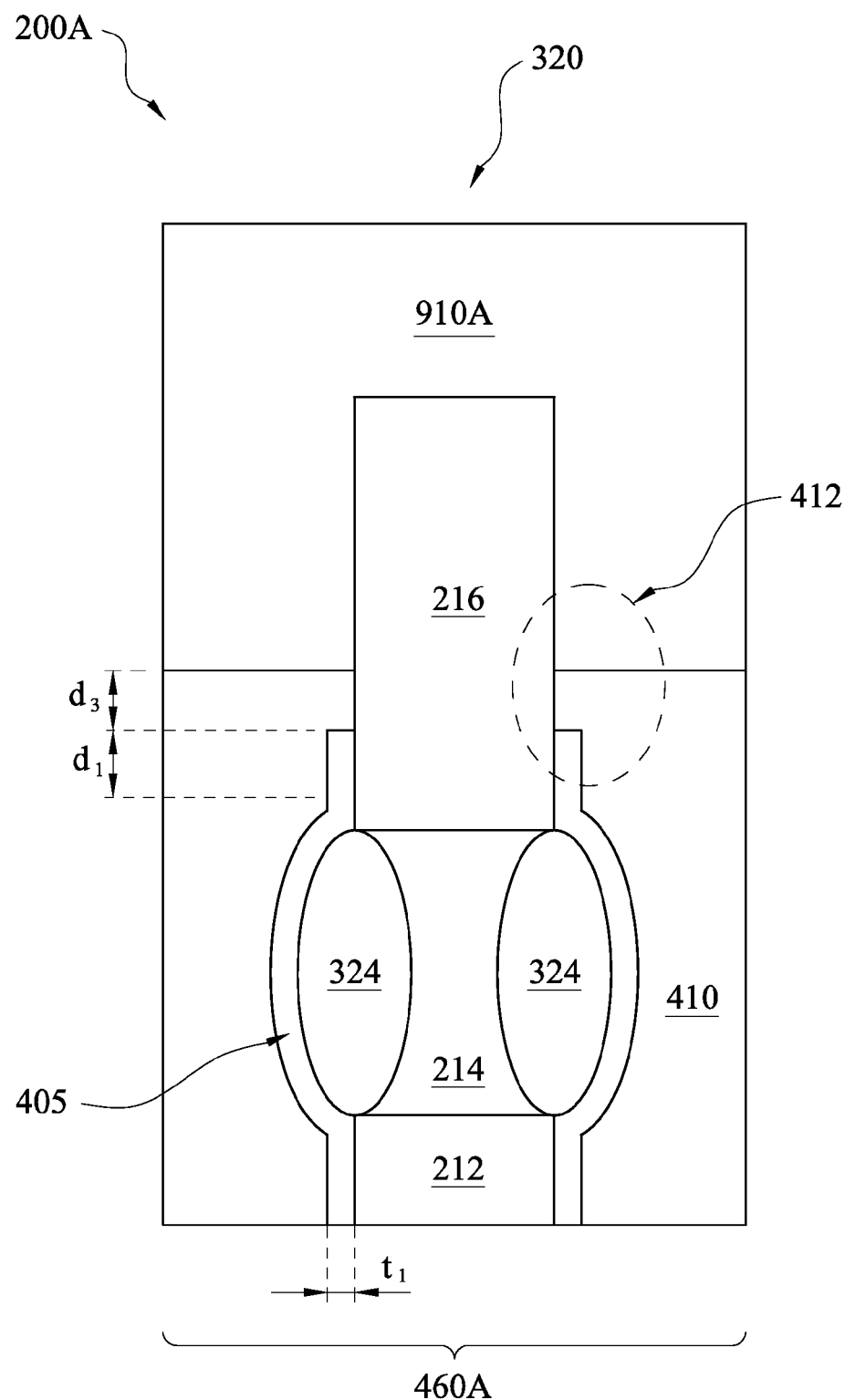
FIGS. 13C and 13D are cross-sectional views of an example FinFET device along the line A-A in FIG. 13A at fabrication stages constructed according to the method of FIG. 1.
Figure 13D:
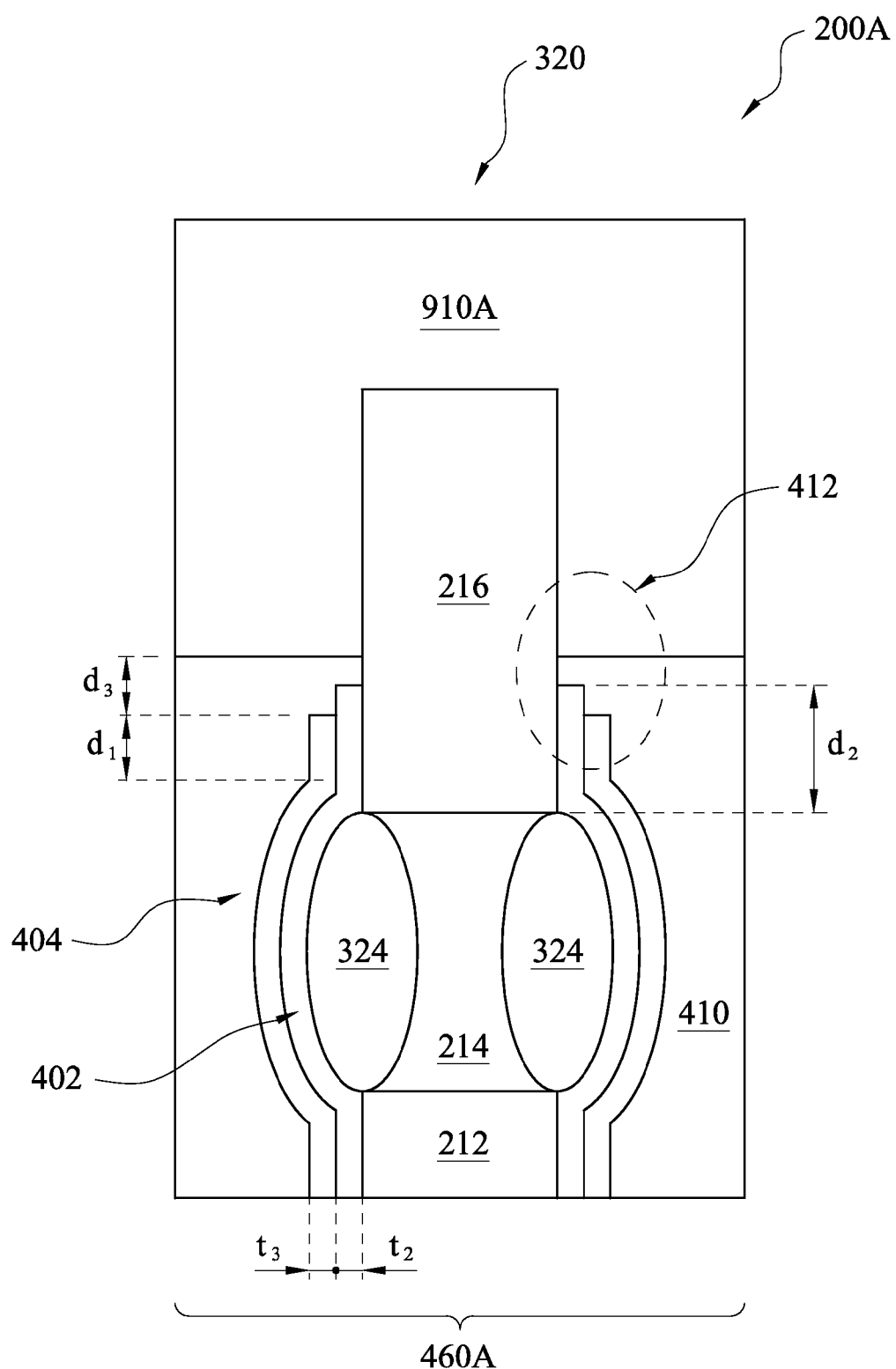
Figure 13E:
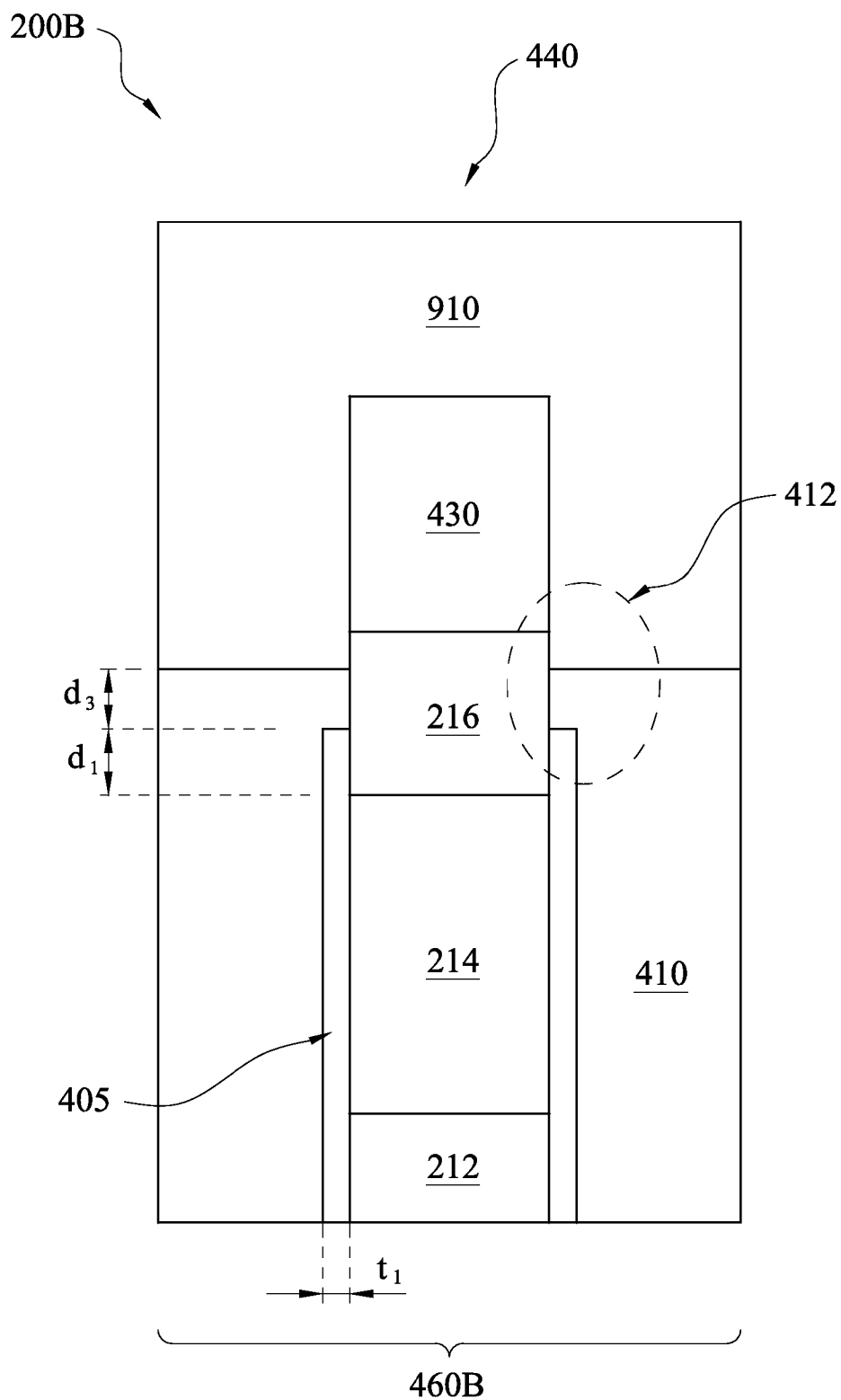
FIGS. 13E and 13F are cross-sectional views of an example FinFET device along the line B-B in FIG. 13B at fabrication stages constructed according to the method of FIG. 1.
Figure 13F:
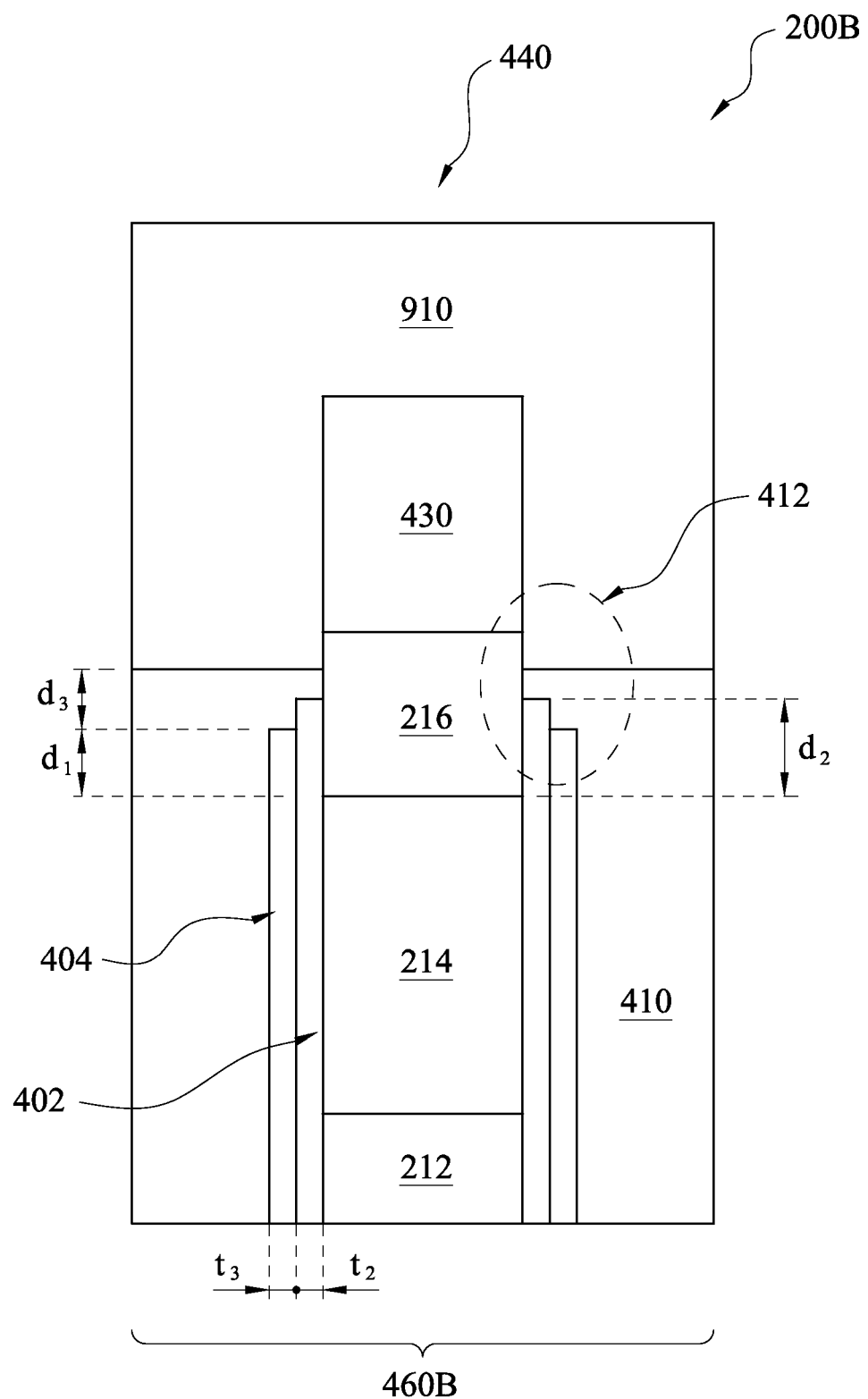

Referring to FIGS. 1 and 12A-12B, the method 100 proceeds to step 126 by forming an interlayer dielectric (ILD) layer 720 on the substrate 210 between the gaps of the dummy gate stacks 510. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the FinFET device 200.

Referring also to FIGS. 1 and 12A-12B, the method 100 proceeds to step 128 by removing the dummy gate stacks 510 in the first gate region 460A to form one or more first gate trench 810A and in the second gate region 460B to form one or more second gate trench 810B. The upper portion of the second fin structure 320 is exposed in the first gate trench 810A and the upper portion of the third fin structure 440 is exposed in the second gate trench 810B. The dummy gate stacks 510 are removed by an etch process (such as selective wet etch or selective dry etch) designed to have an adequate etch selectivity with respect to the third semiconductor material layer 216 in the first gate trench 810A and the fourth semiconductor material layer 430 in the second gate trench 810B. The etch process may include one or more etch steps with respective etchants. The gate hard mask layer 516 and the spacers 520 are removed as well. Alternatively, the dummy gate stack 510 may be removed by a series of processes including photolithography patterning and etching process.

Referring to FIGS. 1 and 13A-13F, the method 100 proceeds to step 130 by forming a first and a second high-k/metal gate (HK/MG) stacks, 910A and 910B, over the substrate 210, including wrapping over a portion of the second fins 320 in the first gate trench 810A and a portion of the third fin structure 440 in the second gate trench 810B, respectively. The first and the second HK/MG stacks, 910A and 910B, include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the first and the second HK/MG stacks, 910A and 910B, includes depositions to form various gate materials and a CMP process to remove the excessive gate materials and planarize the top surface of the NFET device 200A and the PFET device 200B.

In one embodiment, the gate dielectric layer includes an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitride (SiON), or other suitable materials. The gate dielectric layers wrap over the upper portion of the second fin structures 320 in the first gate region 460A and the upper portion of the third fin structures 440 in the second gate region 460B.

A metal gate (MG) electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately for the NFET 200A and the PFET 200B with different metal layers. A CMP process may be performed to remove excessive MG electrode.

Referring again to FIGS. 13C and 13D, in the NFET device 200A, the first HK/MG gate 910A wraps over the upper portion of the second fin 320, where the second fin structure 320 includes the semiconductor material layer 216 as its upper portion, the second semiconductor material layer 214, with a semiconductor oxide feature 324 at its outer layer, as its middle portion and the first semiconductor material layer 212 as its bottom portion. The liner 405 is formed along sidewalls of the second fin structure such that along a lower portion of the third semiconductor material layer 216; along the semiconductor oxide feature 324 and along the first semiconductor material layer 212. The top surface of the liner 405 is above a top surface of the second semiconductor material layer 214 with the first distance $d_1$. The recessed dielectric layer 410 is formed between each of second fin structures 320. The top surface of the recessed dielectric layer 410 is above the top surface of the liner 405 with the third distance $d_3$.

Referring again to FIGS. 13E and 13F, in the PFET device 200b, the second HK/MG gate 910B wraps over the upper portion of the third fin structure 440, where the includes the fourth semiconductor material layer 430 as its upper portion, the third semiconductor material layer 216 as its upper middle portion, the second semiconductor material layer 214 as its lower middle portion and the first semiconductor material layer 212 as its bottom portion. The liner 405 is formed along sidewalls of the third fin structure 440 such that, it wraps along a lower portion of the third semiconductor material layer 216; along the second semiconductor material layer 214 and along the first semiconductor material layer 212. The top surface of the liner 405 is above the top surface of the second semiconductor material layer 214 with the first distance $d_1$. The recessed dielectric layer 410 is formed between each of third fin structures 440 and the top surface of the recessed dielectric layer 410 is above the top surface of the liner 405 with the third distance $d_3$.

When the liner includes the first layer 402 and the second layer 404, the top surface of the first layer 402 is above the second semiconductor material layer 214 with a second distance $d_2$, which is larger than the first distance $d_1$ but it is at same or below the top surface of the recessed dielectric layer 410.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers structures of a FinFET. The structures employ a liner wrapping over the fin structures to retard out-diffusion in a gate region and provide a buffer for the fin structure in the gate region. The structured demonstrate device performance improvement.

The present disclosure provides an embodiment of a fin-like field-effect transistor (FinFET) device. The device includes a substrate having a first gate region, a first fin structure over the substrate in the first gate region. The first fin structure includes an upper semiconductor material member, a lower semiconductor material member, surrounded by an oxide feature and a liner wrapping around the oxide feature of the lower semiconductor material member, and extending upwards to wrap around a lower portion of the upper semiconductor material member. The device also includes a dielectric layer laterally proximate to an upper portion of the upper semiconductor material member. Therefore the upper semiconductor material member includes a middle portion that is neither laterally proximate to the dielectric layer nor wrapped by the liner.

The present disclosure also provides another embodiment of a fin-like field-effect transistor (FinFET) device. The device includes a second fin structure over the substrate, in a second gate region. The second fin structure includes an upper semiconductor material member, a middle semiconductor material member and a lower semiconductor material member, the liner wrapping around the lower semiconductor material member and the middle semiconductor material member and extending upwards to wrap around a lower portion of the upper semiconductor material member. The device also includes the dielectric layer laterally proximate to an upper portion of the middle semiconductor material member. The middle semiconductor material member includes an upper portion that is neither laterally proximate to the dielectric layer nor wrapped by the liner and a second high-k/metal gate stack over the substrate, including wrapping over the upper semiconductor material member and the upper portion of the middle semiconductor material member in the second gate region.

The present disclosure also provides a method for fabricating a FinFET. The method includes providing a substrate having an n-type fin-like field-effect transistor (NFET) region and a p-type fin-like field-effect transistor (PFET) region, forming first fin structures in the NFET region and the PFEN region. The first fin structure includes a first epitaxial semiconductor material layer as its upper portion; a second epitaxial semiconductor material layer, with a semiconductor oxide feature at its outer layer, as its middle portion and a third semiconductor material layer as its bottom portion. The method also includes forming a patterned oxidation-hard-mask (OHM) over the NFET region and PFEN region to expose the first fin structure in a first gate region of the NFET region. The method also includes applying annealing to form a semiconductor oxide feature at out layer of the second semiconductor material layer in the first fin structure in the first gate region. The method also includes forming a liner wrapping over the first fins in both of the NFET region and the PFET region, depositing a dielectric layer between the first fins, recessing the liner and forming a second fin structure in the PFET region after covering the NFET region with a hard mask layer. The method also includes recessing the liner in the NFET region after removing the hard mask layer and recessing the dielectric layer in both of the NFET region and the PFET region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin structure over a substrate;
   after forming the fin structure over a substrate, forming an oxide feature around the fin structure such that a first portion of the fin structure is positioned above the oxide feature and a second portion of the fin structure is positioned below the oxide feature;
   forming a liner layer directly on the second portion of the fin structure, the oxide feature and the first portion of the fin structure;
   forming a dielectric layer on the liner layer;
   removing a portion of the liner layer and a portion of the dielectric layer to expose the fin structure;
   forming a gate dielectric layer on the fin structure, a remaining portion of the liner layer, and a remaining portion of the dielectric layer; and
   forming a gate electrode on the gate dielectric layer.

2. The method of claim 1, wherein forming the fin structure over the substrate includes:
   forming a first semiconductor material layer over the substrate;
   forming a second semiconductor material layer over the first semiconductor material layer, the second semiconductor material layer being different that the first semiconductor material layer; and
   patterning the first and second semiconductor material layers to form the fin structure.

3. The method of claim 2, wherein forming the oxide feature around the fin structure includes forming the oxide feature around the patterned first semiconductor material layer.

4. The method of claim 2, wherein forming the liner layer directly on the second portion of the fin structure, the oxide feature and the first portion of the fin structure includes forming the liner layer directly on a sidewall of the patterned second semiconductor material layer.

5. The method of claim 4, wherein after removing the portion of the liner layer and the portion of the dielectric layer to expose the fin structure, the sidewall of the patterned second semiconductor material layer is exposed.

6. The method of claim 5, wherein forming the gate dielectric layer on the fin structure, the remaining portion of the liner layer, and the remaining portion of the dielectric layer includes forming the gate dielectric layer directly on the exposed sidewall of the patterned second semiconductor material layer.

7. The method of claim 1, wherein after removing the portion the liner layer and the portion of the dielectric layer to expose the fin structure, the oxide feature remains covered by the remaining portion of the liner layer.

8. The method of claim 1, further comprising:
   recessing a portion of the fin structure after removing the portion of the liner layer and the portion of the dielectric layer to expose the fin structure; and
   forming a source/drain feature on the recessed portion of the fin structure.

9. The method of claim 1, wherein the liner layer includes a material selected from the group consisting of silicon nitride, silicon oxynitride and aluminum oxide.

10. The method of claim 1, wherein forming the fin structure over the substrate includes forming another fin structure over the substrate,
    wherein forming the oxide feature around the fin structure includes performing an oxidation process, and
    wherein the another fin structure is protected during the performing of the oxidation process thereby preventing an oxide feature from forming around the another fin structure.

11. A method comprising:
    forming a first fin structure over a substrate, the first fin structure including:
      a first semiconductor material layer; and
      a second semiconductor material layer disposed over the first semiconductor material layer, the second semiconductor material layer being different than the first semiconductor material layer;
    forming a liner layer extending along a sidewall of the first semiconductor material layer and along a sidewall of the second semiconductor material layer;
    forming a dielectric isolation feature adjacent the first and second semiconductor material layers, wherein after forming the dielectric isolation feature, a first portion of the sidewall of the second semiconductor material layer is covered by the dielectric isolation feature and a second portion of the sidewall of the second semiconductor material layer is exposed;

forming a gate dielectric layer on the exposed second portion of the sidewall of the second semiconductor material layer;

forming a gate electrode layer over the gate dielectric;

forming a second fin structure over a substrate, the second fin structure including:
   the first semiconductor material layer; and
   the second semiconductor material layer disposed over the first semiconductor material layer; and performing an oxidation process to form an oxide feature around the first semiconductor material layer of the second fin structure, wherein the first fin structure is protected during the performing of the oxidation process thereby preventing oxide from forming around the first semiconductor material layer of the first fin structure.

12. The method of claim 11, wherein the first fin structure further includes a third semiconductor material layer disposed over the second semiconductor material layer,
   wherein after forming the dielectric isolation feature, a sidewall of the third semiconductor material layer is exposed, and
   wherein forming the gate dielectric layer on the exposed second portion of the sidewall of the second semiconductor material layer includes forming the gate dielectric layer on the exposed sidewall of the third semiconductor material layer.

13. The method of claim 11, further comprising forming another liner layer on the liner layer extending along the sidewall of the first semiconductor material layer and along the sidewall of the second semiconductor material layer.

14. The method of claim 13, wherein forming the dielectric isolation feature adjacent the first and second semiconductor material layers includes forming the dielectric isolation feature directly on a portion of the liner layer and a portion of the another liner layer.

15. The method of claim 11, further comprising forming a hard mask layer extending along the sidewall of the first semiconductor material layer and along the sidewall of the second semiconductor material layer, and
   removing the hard mask layer extending along the sidewall of the first semiconductor material layer and along the sidewall of the second semiconductor material layer prior to forming the liner layer extending along the sidewall of the first semiconductor material layer and along the sidewall of the second semiconductor material layer.

16. The method of claim 11, further comprising:
   wherein forming the liner layer includes forming the liner layer extending along a sidewall of the first semiconductor material layer of the second fin structure and along a sidewall of the second semiconductor material layer of the second fin structure;
   wherein forming the dielectric isolation feature includes forming another dielectric isolation feature adjacent the first and second semiconductor material layers of the second fin structure, wherein after forming the another dielectric isolation feature adjacent the first and second semiconductor material layers of the second fin structure, a first portion of the sidewall of the second semiconductor material layer of the second fin structure is covered by the another dielectric isolation feature and a second portion of the sidewall of the second semiconductor material layer of the second fin structure is exposed;
   wherein forming the gate dielectric layer includes forming the gate dielectric on the exposed second portion of the sidewall of the second semiconductor material layer of the second fin structure; and
   wherein forming the gate electrode over the gate dielectric includes forming the gate electrode over the gate dielectric on the second portion of the sidewall of the second semiconductor material layer of the second fin structure.

17. The method of claim 15, wherein the first semiconductor material layer includes silicon germanium,
   wherein the second semiconductor material layer includes silicon, and
   wherein the oxide feature includes silicon germanium oxide.

18. A method comprising:
providing a substrate having an n-type fin-like field-effect transistor (NFET) region and a p-type fin-like field-effect transistor (PFET) region;

forming first fin structures in the NFET region and the PFET region, the first fin structure includes:
   a first epitaxial semiconductor material layer as its upper portion;
   a second epitaxial semiconductor material layer, with a semiconductor oxide feature at its outer layer, as its middle portion; and
   a third semiconductor material layer as its bottom portion;

forming a patterned oxidation-hard-mask (OHM) over the NFET region and PFET region to expose the first fin structure in a first gate region of the NFET region;

applying annealing to form a semiconductor oxide feature out of the second epitaxial semiconductor material layer in the first fin structure in the first gate region;

forming a liner wrapping over the first fin structures in both of the NFET region and the PFET region;

depositing a dielectric layer between the first fin structures;

recessing the liner in the PFET region after covering the NFET region with a hard mask layer;

forming a second fin structure in the PFET region while covering the NFET region with the hard mask layer;

recessing the liner in the NFET region after removing the hard mask layer; and recessing the dielectric layer in both of the NFET region and the PFET region.

19. The method of claim 18, further comprising:
forming dummy gates in the first gate region and a second gate region in the second fin structure.

forming a first source/drain (S/D) features in a first S/D region in the first fin structure in the NFET;

forming a second S/D feature in a second S/D region in the second fin structure in the PFET;

replacing the dummy gates by a first high-k/metal gate (HK/MG) in the NFET region, including wrapping over an upper portion of the first fin structure in the first gate region; and replacing the dummy gates by a second HK/MG in the PFET region, including wrapping over an upper portion of the second fin structure in a second gate region.

20. The method of claim 18, wherein further comprising:
controlling recessing the liner to have its top surface be above the second semiconductor material layer with a first distance; and
controlling recessing the dielectric layer to have its top surface be above the second semiconductor material layer with a second distance, which is larger than the first distance.

* * * * *